United States Patent
Yamazaki et al.

(10) Patent No.: US 8,138,614 B2
(45) Date of Patent: Mar. 20, 2012

(54) SEMICONDUCTOR DEVICE HAVING AN ANTENNA WITH ANISOTROPIC CONDUCTIVE ADHESIVE

(75) Inventors: Shunpei Yamazaki, Setagaya (JP); Koji Dairiki, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 690 days.

(21) Appl. No.: 11/702,085

(22) Filed: Feb. 5, 2007

(65) Prior Publication Data

US 2007/0181875 A1    Aug. 9, 2007

(30) Foreign Application Priority Data

Feb. 8, 2006  (JP) .................................. 2006-031720

(51) Int. Cl.
*H01L 23/48* (2006.01)
*H01L 29/40* (2006.01)
*H01L 29/04* (2006.01)

(52) U.S. Cl. .......... 257/783; 257/72; 257/536; 257/734; 257/E27.111

(58) Field of Classification Search ............... 257/72, 257/783, 536, 679, 922, 734, 758, E27.111
See application file for complete search history.

(56) References Cited

U.S. PATENT DOCUMENTS

| | | | | |
|---|---|---|---|---|
| 4,278,510 A | * | 7/1981 | Chien et al. | 205/158 |
| 4,642,263 A | * | 2/1987 | Culbertson | 428/336 |
| 4,851,487 A | * | 7/1989 | Yaniger et al. | 525/540 |
| 6,018,299 A | | 1/2000 | Eberhardt | |
| 6,107,920 A | | 8/2000 | Eberhardt et al. | |
| 6,153,726 A | | 11/2000 | Kathirgamanathan et al. | |
| 6,359,444 B1 | * | 3/2002 | Grimes | 324/633 |
| 6,919,215 B2 | | 7/2005 | Yamazaki et al. | |
| 6,937,153 B2 | | 8/2005 | Redlin | |
| 7,141,451 B2 | | 11/2006 | Tsunoda et al. | |
| 7,183,928 B2 | | 2/2007 | Redlin | |
| 7,243,421 B2 | | 7/2007 | Bentley et al. | |
| 2003/0213939 A1 | | 11/2003 | Narayan et al. | |
| 2004/0001000 A1 | * | 1/2004 | Redlin | 340/572.8 |
| 2004/0080048 A1 | * | 4/2004 | Haruta et al. | 257/741 |

(Continued)

FOREIGN PATENT DOCUMENTS

EP     0 921 147    6/1999

(Continued)

OTHER PUBLICATIONS

Partial European Search Report (Application No. 07002102.7) Dated May 11, 2007.

(Continued)

*Primary Examiner* — Shouxiang Hu
(74) *Attorney, Agent, or Firm* — Eric J. Robinson; Robinson Intellectual Property Law Office, P.C.

(57) ABSTRACT

It is an object to provide a semiconductor device capable of transmitting and receiving data with a reader/writer and reducing breakdown or interference due to static electricity. A semiconductor device includes a semiconductor integrated circuit, a conductive layer serving as an antenna that is connected to the semiconductor integrated circuit, and a substrate interposing the semiconductor integrated circuit and the conductive layer, where at least one of a layer forming the semiconductor integrated circuit, a layer covering the semiconductor integrated circuit, and the substrate is formed from a conductive polymer. In accordance with the above structure, wireless communication with a reader/writer is possible, and breakdown or malfunction in the semiconductor integrated circuit due to static electricity is reduced.

12 Claims, 18 Drawing Sheets

U.S. PATENT DOCUMENTS

| | | |
|---|---|---|
| 2004/0162397 A1* | 8/2004 | Lee et al. .................. 525/420 |
| 2005/0035805 A1 | 2/2005 | Tanada |
| 2005/0130397 A1 | 6/2005 | Bentley et al. |
| 2005/0134463 A1 | 6/2005 | Yamazaki |
| 2005/0134464 A1 | 6/2005 | Redlin |
| 2005/0148121 A1 | 7/2005 | Yamazaki et al. |
| 2005/0153078 A1 | 7/2005 | Bentley et al. |
| 2006/0117554 A1* | 6/2006 | Herrmann et al. ............. 29/601 |
| 2006/0134318 A1 | 6/2006 | Hudd et al. |
| 2006/0290501 A1* | 12/2006 | Hammad et al. ........... 340/572.1 |

FOREIGN PATENT DOCUMENTS

| | | |
|---|---|---|
| EP | 1 522 956 | 4/2005 |
| JP | 05-091044 | 12/1993 |
| JP | 05334912 A * | 12/1993 |
| JP | 2005-115646 | 4/2005 |
| WO | WO 03/085681 | 10/2003 |
| WO | WO-2004/068389 | 8/2004 |
| WO | WO-2005/044451 | 5/2005 |
| WO | WO-2005/045095 | 5/2005 |
| WO | WO-2005/056875 | 6/2005 |

OTHER PUBLICATIONS

European Search Report (Application No. 10010109.6), dated Sep. 5, 2011.

* cited by examiner

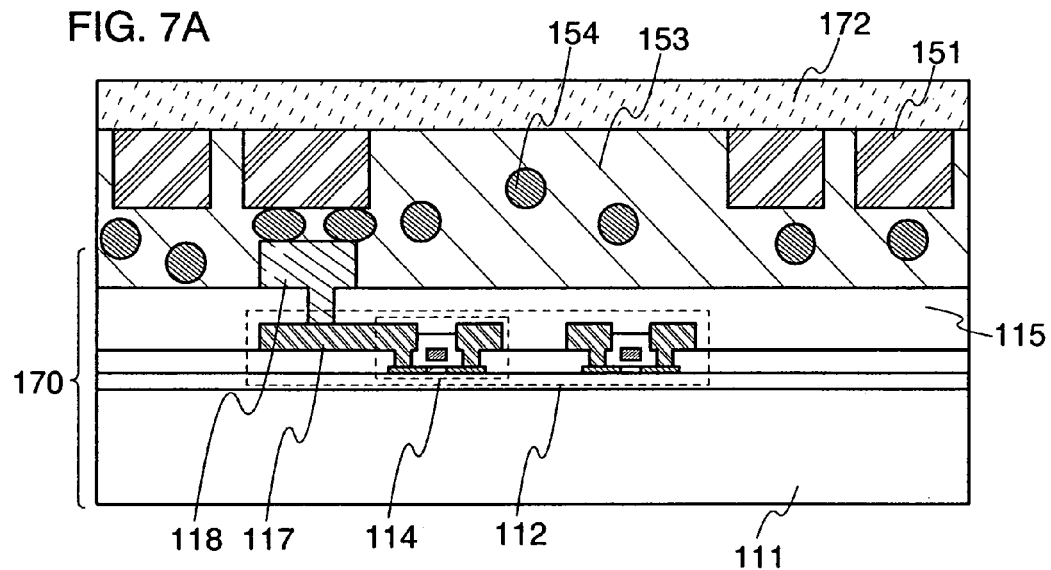
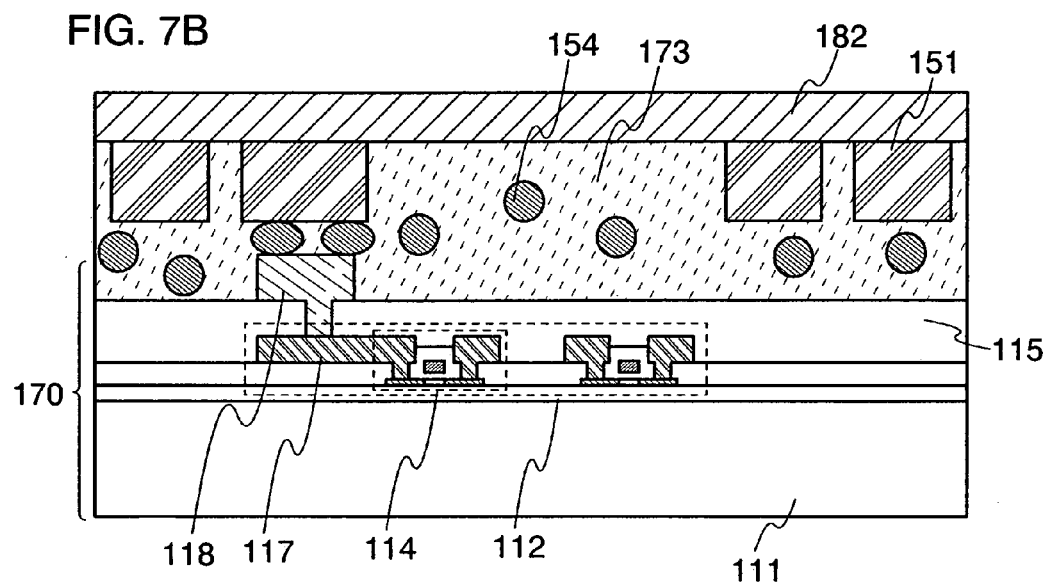

SEMICONDUCTOR DEVICE HAVING AN ANTENNA WITH ANISOTROPIC CONDUCTIVE ADHESIVE

BACKGROUND OF THE INVENTION

1. Field of the Invention

The present invention relates to a semiconductor device transmitting and receiving data by wireless communication through an antenna such as an IC card, an RFID tag, an IC tag, an ID tag, a transponder, an IC chip, or an ID chip.

2. Description of the Related Art

A semiconductor device including an antenna and a semiconductor integrated circuit electrically connected to the antenna has been attracted attention as an RFID tag. A manufacturing method of an RFID tag has been proposed, in which a plurality of antennas is provided over a flexible substrate, and a semiconductor integrated circuit is electrically connected to the plurality of antennas (refer to Patent Document 1: Japanese Published Patent Application No. 2005-115646).

A semiconductor device that transmits and receives data by wireless communication through an antenna is interposed between organic resins, and static electricity is easy to be charged in the organic resins. In addition, due to static electricity charged in the semiconductor device, the semiconductor integrated circuit inside the semiconductor device may be broken down and malfunction may be caused by imparting noise to an electric signal.

Therefore, in order to avoid breakdown or interference due to static electricity, a surface of the semiconductor device is covered with a metal plate, whereby a method for preventing breakdown or malfunction in the semiconductor integrated circuit due to static electricity has been implemented.

Although interference due to static electricity is reduced by covering the semiconductor device with the metal plate, transmission and reception of an electromagnetic wave or an electric wave are also obstructed. Then, a communication function of the semiconductor device is degraded. Accordingly, the semiconductor device has a problem in that an electromagnetic wave or an electric wave cannot be transmitted and received through an antenna.

SUMMARY OF THE INVENTION

Consequently, it is an object of the present invention to provide a semiconductor device capable of transmitting and receiving data to and from a reader/writer and reducing breakdown or interference due to static electricity.

The present invention has a feature in that a semiconductor integrated circuit, a conductive layer serving as an antenna that is electrically connected to the semiconductor integrated circuit, and one or a plurality of substrates that is provided to cover the semiconductor integrated circuit and the conductive layer are included, and in that at least one of a layer forming the semiconductor integrated circuit, a layer covering the semiconductor integrated circuit, and the substrate is formed from a conductive polymer.

One aspect of the present invention is a semiconductor device including a semiconductor integrated circuit, a conductive layer serving as an antenna that is electrically connected to the semiconductor integrated circuit, where one or a plurality of substrates that is provided to cover the semiconductor integrated circuit and the conductive layer, and at least one of the substrates is formed from a conductive polymer.

It is to be noted that the substrate interposing the semiconductor integrated circuit and the conductive layer may be formed from cellulosic fiber and conductive polymer fiber.

Another aspect of the present invention is a semiconductor device including a semiconductor integrated circuit, a conductive layer serving as an antenna that is electrically connected to the semiconductor integrated circuit, one or a plurality of substrates that is provided to cover the semiconductor integrated circuit and the conductive layer, and an adhesive bonding the semiconductor integrated circuit and the substrate, where the adhesive is formed from a composition having a conductive polymer.

Another aspect of the present invention is a semiconductor device including a semiconductor integrated circuit, a conductive layer serving as an antenna that is electrically connected to the semiconductor integrated circuit, and a layer covering the semiconductor integrated circuit, where the layer covering the semiconductor integrated circuit is formed from a conductive polymer.

Another aspect of the present invention is a semiconductor device including a semiconductor integrated circuit, a conductive layer serving as an antenna that is electrically connected to the semiconductor integrated circuit, and a layer covering the semiconductor integrated circuit and the antenna, where the layer covering the semiconductor integrated circuit and the antenna is formed from a conductive polymer.

Another aspect of the present invention is a semiconductor device including a semiconductor integrated circuit, a connection terminal electrically connected to the semiconductor integrated circuit, a layer covering part of the connection terminal, which is formed over the semiconductor integrated circuit, a substrate provided with a conductive layer serving as an antenna, and an anisotropic conductive adhesive including a conductive particle that electrically connects the connection terminal and the conductive layer serving as an antenna and that bonds the substrate and the semiconductor integrated circuit, where the layer covering part of the connection terminal is formed from a conductive polymer. Further, a plurality of connection terminals is provided, the layer covering part of the connection terminal is divided, and the divided layer covering part of the connection terminal is not necessary to be connected to two or more of connection terminals.

Another aspect of the present invention is a semiconductor device including a semiconductor integrated circuit, a connection terminal electrically connected to the semiconductor integrated circuit, a substrate provided with a conductive layer serving as an antenna, a layer covering part of the conductive layer serving as an antenna, and an anisotropic conductive adhesive including a conductive particle that electrically connects the connection terminal and the conductive layer serving as an antenna and that bonds the substrate and the semiconductor integrated circuit, where the layer covering part of the conductive layer serving as an antenna is formed from a conductive polymer.

Another aspect of the present invention is a semiconductor device including a semiconductor integrated circuit, a connection terminal electrically connected to the semiconductor integrated circuit, a substrate provided with a conductive layer serving as an antenna, and an anisotropic conductive adhesive including a conductive particle that electrically connects the connection terminal and the conductive layer serving as an antenna and that bonds the substrate and the semiconductor integrated circuit, where the anisotropic conductive adhesive is formed from a composition having a conductive polymer.

It is to be noted that volume resistivity of the conductive polymer is greater than or equal to $10^{-3}$ $\Omega \cdot cm$ and less than or equal to $10^{12}$ $\Omega \cdot cm$, preferably greater than or equal to $1$ $\Omega \cdot cm$ and less than or equal to $10^9$ Ω·cm, further preferably, greater than or equal to $10^3$ Ω·cm and less than or equal to $10^6$ Ω·cm.

A semiconductor device of the present invention includes a substrate or a layer over one side surface or both side surfaces of the semiconductor integrated circuit, using a conductive polymer of which volume resistivity is greater than or equal to $10^{-3}$ Ω·cm and less than or equal to $10^{12}$ Ω·cm, preferably greater than or equal to 1 Ω·cm and less than or equal to $10^9$ Ω·cm, further preferably, greater than or equal to $10^3$ Ω·cm and less than or equal to $10^6$ Ω·cm. Therefore, the semiconductor device of the present invention is capable of wireless communication with a reader/writer, and breakdown or malfunction in the semiconductor integrated circuit due to static electricity are reduced.

Further, a semiconductor device of the present invention includes a layer over one side surface or both side surfaces of the semiconductor integrated circuit, using a conductive polymer of which volume resistivity is greater than or equal to $10^{-3}$ Ω·cm and less than or equal to $10^{12}$ Ω·cm, preferably greater than or equal to 1 Ω·cm and less than or equal to $10^9$ Ω·cm, further preferably, greater than or equal to $10^3$ Ω·cm and less than or equal to $10^6$ Ω·cm. Therefore, the semiconductor device of the present invention is thin and capable of wireless communication with a reader/writer, and breakdown or malfunction in the semiconductor integrated circuit due to static electricity are reduced. Moreover, the number of substrates and the amount of adhesive can be reduced, and then cost can be reduced.

BRIEF DESCRIPTION OF DRAWINGS

FIGS. 7A and 7B are cross-sectional views each showing a semiconductor device of the present invention.

DETAILED DESCRIPTION OF THE INVENTION

Figure 1A:
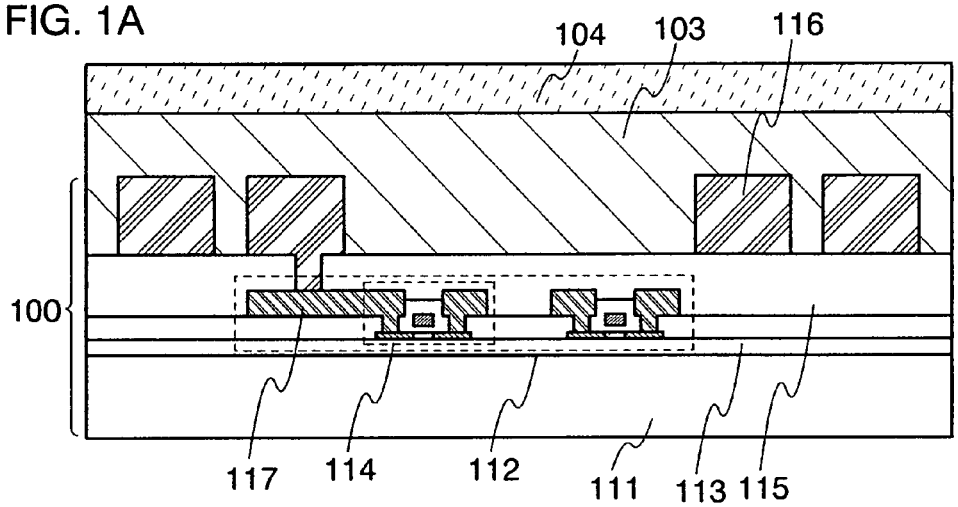
FIGS. 1A to 1C are cross-sectional views each showing a semiconductor device of the present invention.

Embodiment modes of the present invention will be explained below with reference to drawings. However, the present invention can be implemented in various different modes, and the present invention is easily understood by those skilled in the art that various changes and modifications are possible, unless such changes and modifications depart from the purpose and the scope of the invention. Therefore, the present invention is not construed as being limited to the description of the embodiment mode. It is to be noted that the same portion or a portion having the same function is denoted by the same reference numeral in all the drawings for explaining embodiment modes, and the explanation thereof is omitted.

Embodiment Mode 1

In this embodiment mode, a semiconductor device using a substrate that is formed from a conductive polymer will be explained with reference to FIGS. 1A to 1C.

As shown in FIG. 1A, in a semiconductor device of this embodiment mode, a chip 100 including a semiconductor element and a substrate 104 formed from a conductive polymer are attached to each other with an adhesive 103, and the substrate 104 formed from a conductive polymer is provided to cover the chip including a semiconductor element.

The conductive polymer forming the substrate 104 is formed from an organic compound having conductivity of which volume resistivity is greater than or equal to 1 Ω·cm and less than or equal to 10 Ω·cm, preferably greater than or equal to 1 Ω·cm and less than or equal to $10^9$ Ω·cm further preferably, greater than or equal to $10^3$ Ω·cm and less than or equal to $10^6$ Ω·cm. As the organic compound having conductivity of which volume resistivity is greater than or equal to $10^{-3}$ Ω·cm and less than or equal to $10^{12}$ Ω·cm, preferably greater than or equal to 1 Ω·cm and less than or equal to $10^9$ Ω·cm, further preferably, greater than or equal to $10^3$ Ω·cm and less than or equal to $10^6$ Ω·cm, polythiophene, polypyrrole, polyaniline, polyphenylenevinylene, polyacene, polyacetylene, polyacrylonitrile, polyperinaphthalene, or the like can be used. The substrate 104 formed from a conductive polymer may have flexibility.

When a substrate formed from a conductive polymer of which volume resistivity is greater than or equal to $10^{-3}$ Ω·cm is provided to cover the chip including a semiconductor element, wireless communication between the semiconductor device and a reader/writer is possible without interrupting an electric wave or an electromagnetic wave. In addition, when a substrate formed from a conductive polymer of which volume resistivity is less than or equal to $10^{12}$ Ω·cm is provided to cover the chip including a semiconductor element, breakdown of the semiconductor device due to static electricity can be prevented.

As the adhesive 103, a composition mixed with an adhesive organic resin such as an acrylic resin, an epoxy resin, a silicone resin, or a phenolic resin can be used.

As the chip 100 including a semiconductor element, a chip including a thin film semiconductor element can be given. In FIG. 1A, the chip 100 including a semiconductor element has a substrate 111, a semiconductor integrated circuit 112 formed over the substrate 111 with an insulating layer 113 interposed therebetween, and an antenna 116 electrically connected to a thin film transistor 114 forming the semiconductor integrated circuit 112 through an insulating layer 115.

Further, in the semiconductor device shown in FIG. 1A, the insulating layer 115 and the antenna 116 of the chip 100 including a semiconductor element and the substrate 104 formed from a conductive polymer are bonded with the adhesive 103. Thus, the substrate 104 formed from a conductive polymer is provided to cover the chip including a semiconductor element.

As the substrate 111, a glass substrate or a quartz substrate can be used. Further, plastic such as PET (polyethylene terephthalate), PEN (polyethylene naphthalate), PES (polyether sulfone), polypropylene, polypropylene sulfide, polycarbonate, polyetherimide, polyphenylene sulfide, polyphenylene oxide, polysulfone, or polyphthalamide can be used for the substrate. Furthermore, a flexible substrate can be used for the plastic substrate. Moreover, a paper made of a fibrous material can be used.

A substrate where an adhesive organic resin (such as an acrylic resin, an epoxy resin, a silicone resin, or a phenolic resin) as a layer formed from a thermoplastic material is stacked over the plastic substrate can be used. In this case, the substrate 104 formed from a conductive polymer is attached to the chip 100 including a semiconductor element by thermo-compression with the use of a thermal bonding method. Then, part of the substrate 104 (an adhesive organic resin as a layer formed from a thermoplastic material) is melted and then cooled, whereby the substrate 104 can be bonded to the chip 100 including a semiconductor element.

The insulating layer 113 is formed to have a single layer or a stacked layer using an inorganic compound by a sputtering method, a plasma CVD method, a coating method, a printing method, or the like. As a typical example of an inorganic compound, silicon oxide, silicon nitride oxide, silicon oxynitride, or the like can be given. Further, in a case of stacking layers to form the insulating layer, silicon oxide, silicon nitride oxide, and silicon oxynitride may be stacked.

As a typical example of a thin film semiconductor element, a thin film transistor, a capacitor, a resistor, a thin film diode, or the like is given. As the thin film transistor 114, an inversely staggered thin film transistor, a staggered thin film transistor, a top gate thin film transistor, or the like can be used.

The insulating layer 115 can be formed as a similar way to the insulating layer 113. Alternatively, the insulating layer 115 may be formed using an organic compound such as an acrylic resin, a polyimide resin, a melamine resin, a polyester resin, a polycarbonate resin, a phenolic resin, an epoxy resin, a diallylphthalate resin, by a coating method. In addition, the insulating layer 115 may be formed using the following: an inorganic siloxane polymer including a Si—O—Si bond among compounds including silicon, oxygen, and hydrogen formed by using a siloxane polymer-based material as a starting material, which is typified by silica glass; or an organic siloxane polymer in which hydrogen bonded to silicon is substituted by an organic group such as methyl or phenyl, which is typified by an alkylsiloxane polymer, an alkylsilsesquioxane polymer, a silsesquioxane hydride polymer, or an alkylsilsesquioxane hydride polymer.

As for the antenna 116, a conductive layer formed over the insulating layer 115 can be used by a printing method, a method for etching a conductive thin film, a plating method, or the like. The antenna 116 can be formed using a conductive layer including one or more of elements of Ag, Au, Cu, Ni, Pt, Pd, Ir, Rh, W, Al, Ta, Mo, Cd, Zn, Fe, Ti, Zr, and Ba.

Figure 15A:
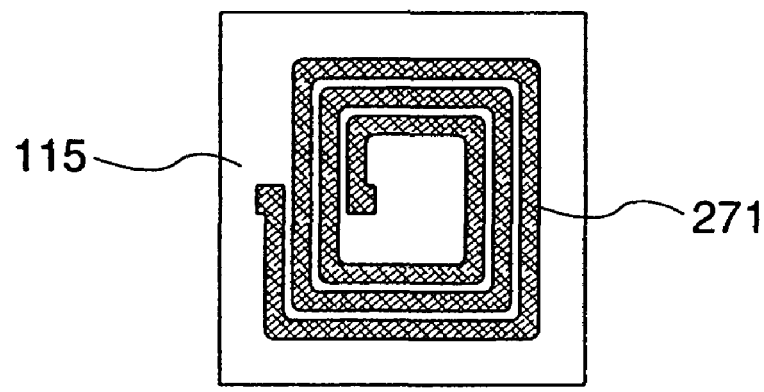
FIGS. 15A to 15C are top views each showing a shape of an antenna that can be applied to the present invention.
Figure 15B:
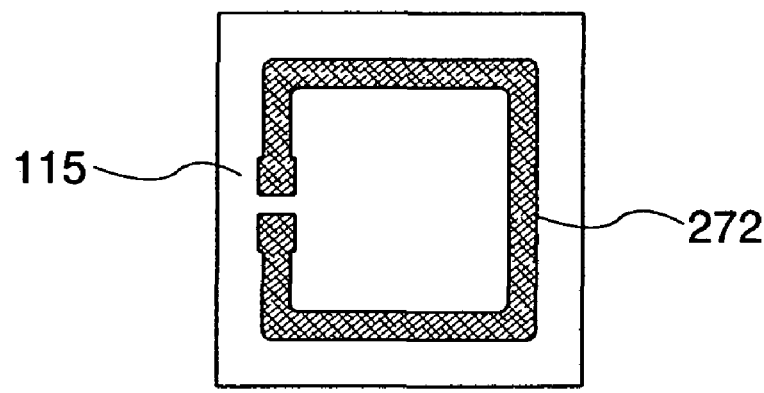
Figure 15C:
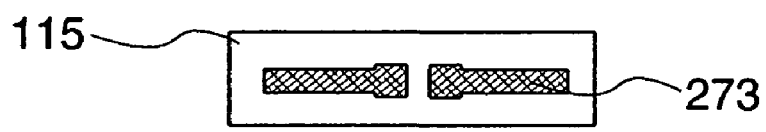

FIGS. 15A to 15C show top views of an antenna that can be applied to the present invention. In a case of applying an electromagnetic coupling method or an electromagnetic induction method (e.g., 13.56 MHz band) as a signal transmission method in the semiconductor device, a shape of a conductive layer serving as an antenna can be a rectangular coiled shape 271 as shown in FIG. 15A or a circular coiled shape (e.g., a spiral antenna) in order to utilize electromagnetic induction caused by changes in the density of a magnetic field. Alternatively, the antenna can have a rectangular-loop shape 272 as shown in FIG. 15B or a circular-loop shape.

In a case of applying a microwave method (e.g., UHF band (860 to 960 MHz band), 2.45 GHz band, or the like), the shape (e.g., length) of a conductive layer serving as an antenna may be determined appropriately by taking into consideration the wavelength of electromagnetic waves that are used for signal transmission. For example, a linear-dipole shape 273 as shown in FIG. 15C, a curved dipole shape, or a plane shape (e.g., a patch antenna) can be used.

Furthermore, the substrate 104 formed from a conductive polymer may be further provided as shown in FIG. 1A over a surface of the substrate 111. The semiconductor integrated circuit is interposed by the substrates formed from a conductive polymer, whereby breakdown of the semiconductor integrated circuit or interference of information transmission and reception due to static electricity from plural directions can be avoided.

It is to be noted that a chip 101 including a semiconductor element may be used, in which the substrate 111 is removed from the chip 100 including a semiconductor element as shown in FIG. 1A. Specifically, as shown in FIG. 1B, an insulating layer 113, a semiconductor integrated circuit 112 formed over the insulating layer 113, and an antenna 116 connected to a wiring 117 of a thin film transistor 114 forming the semiconductor integrated circuit 112 through an insulating layer 115 may be used.

Figure 1B:
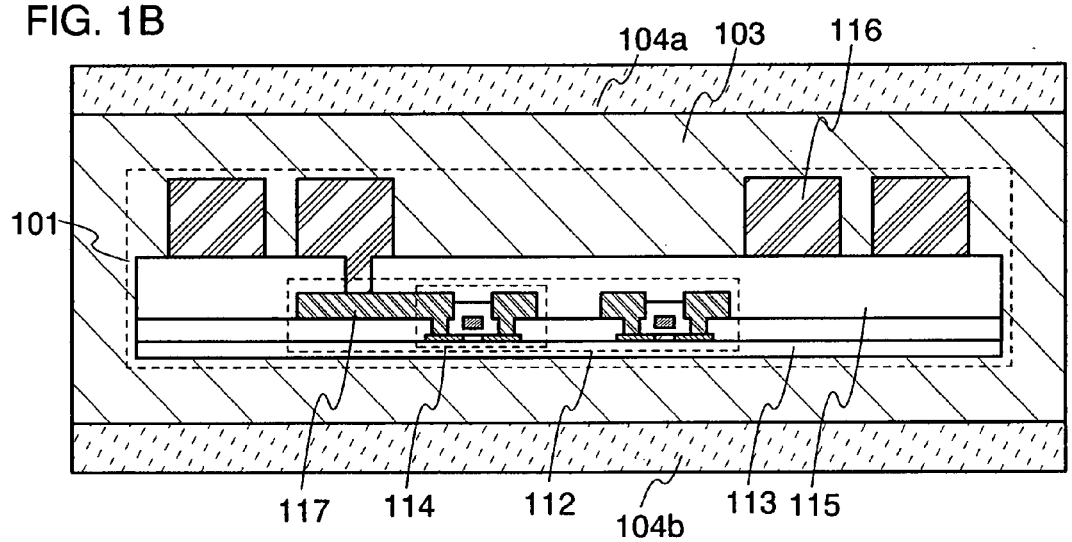

In the semiconductor device shown in FIG. 1B, substrates 104a and 104b are bonded to the chip 101 including a semiconductor element with an adhesive 103, and the substrates 104a and 104b are provided to cover the chip 101 including a semiconductor element. Here, the mode in which the plural surfaces of the chip including a semiconductor element are bonded to the substrates 104a and 104b, respectively. However, a substrate may be used, for bonding and covering only one surface of the chip including a semiconductor element. Alternatively, the chip including a semiconductor element may be interposed by one substrate that is bent. A substrate formed from a conductive polymer is used for one or a plurality of substrates provided to cover the chip including a semiconductor element. Here, the adhesive 103 is provided to surround the chip 101 including a semiconductor element, and the substrate formed from a conductive polymer is used for the both substrates 104a and 104b bonded to the plural surfaces of the chip 101 including a semiconductor element.

Figure 1C:
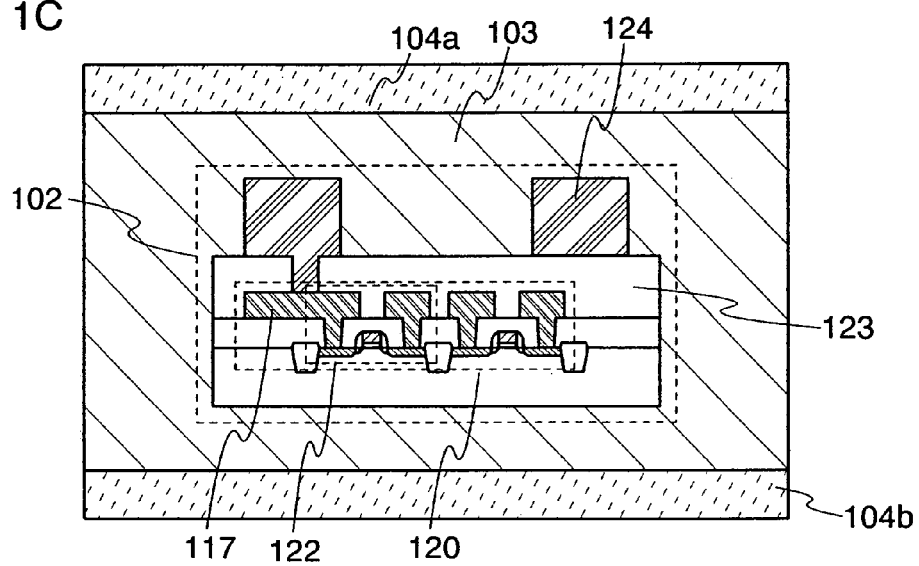

Moreover, as shown in FIG. 1C, a silicon chip using a silicon substrate may be used as a chip 102 including a semiconductor element. Typically, the silicon chip includes a semiconductor integrated circuit 120 including a semiconductor element such as a MOS transistor, a capacitor, a resistor, and a diode over a surface of a silicon wafer, and an antenna 124 electrically connected to the semiconductor element of the semiconductor integrated circuit 120 (here, a MOS transistor 122) through an insulating layer 123.

As the antenna 124, one similar to the antenna 116 shown in FIG. 1A can be appropriately used.

In the semiconductor device shown in FIG. 1C, substrates 104a and 104b are bonded to the chip 102 including a semiconductor element with an adhesive 103, and the substrates 104a and 104b are provided to cover the chip 102 including a semiconductor element, which is similar to the semiconductor device shown in FIG. 1B. Here, the adhesive 103 is provided to surround the chip 102 including a semiconductor element. Further, a substrate formed from a conductive polymer is used for the both substrates 104a and 104b bonded to plural surfaces of the chip 102 including a semiconductor element.

Figure 17:
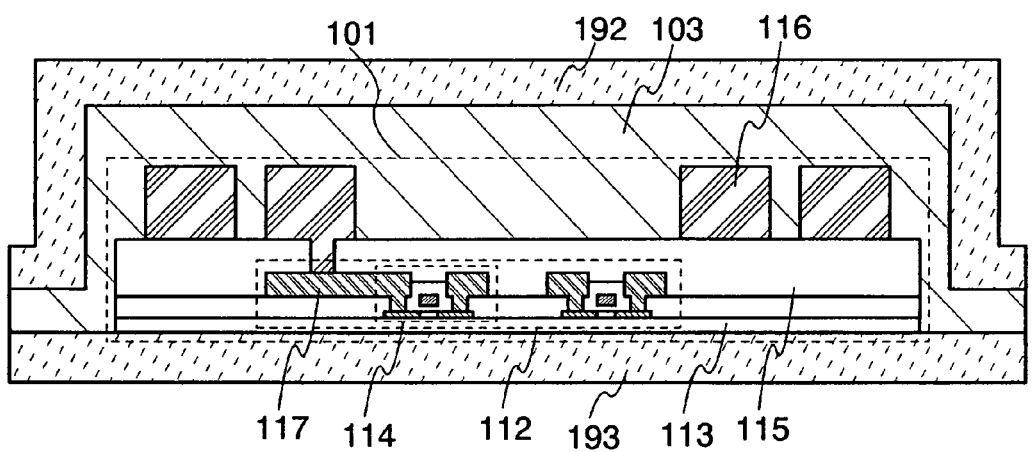
FIG. 17 is a cross-sectional view showing a semiconductor device of the present invention.

Instead of the semiconductor devices shown in FIGS. 1A to 1C, a semiconductor device as shown in FIG. 17 may be used. The semiconductor device has substrates 192 and 193 and a chip 101 including a semiconductor element, in which one of the substrates 192 and 193 is bonded to the chip 101 including a semiconductor element with an adhesive 103, and the substrates 192 and 193 are bonded to each other with the adhesive 103 at outer edges of the chip 101 including a semiconductor element. Here, the both substrates 192 and 193 are provided to cover the chip 101 including a semiconductor element. In addition, a substrate formed from a conductive polymer is used for the substrates 192 and 193. It is to be noted that the chips 100 and 102 including a semiconductor element shown in FIGS. 1A and 1C may be applied instead of the chip 101 including a semiconductor element.

Figure 16A:
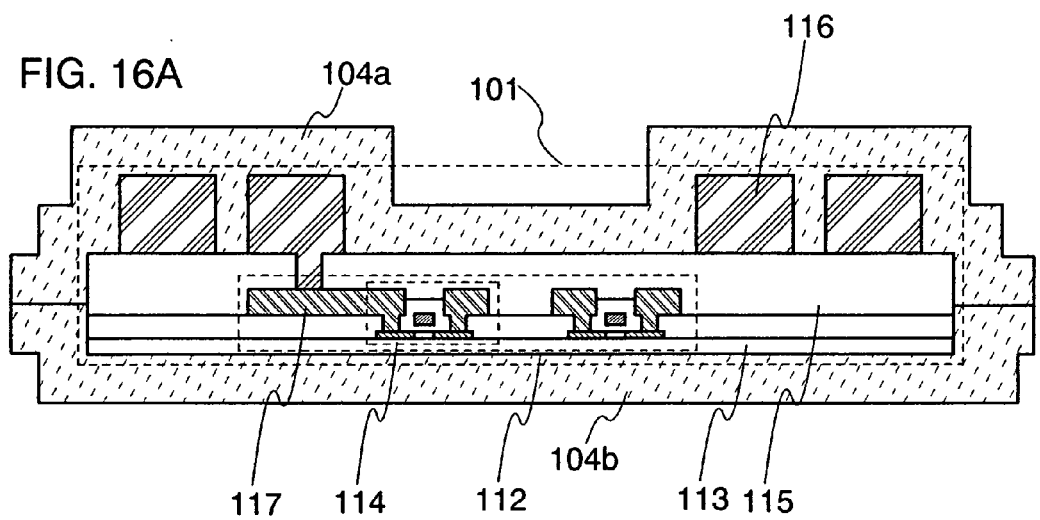
FIGS. 16A and 16B are cross-sectional views each showing a semiconductor device of the present invention.

Further, instead of the semiconductor devices shown in FIGS. 1A to 1C, a semiconductor device as shown in FIG. 16A may be used, in which a chip 101 including a semiconductor element is interposed between substrates 104a and 104b without using an adhesive. The substrates 104a and 104b are provided to cover the chip 101 including a semiconductor element. In addition, a substrate formed from a conductive polymer is used for one of or both the substrates 104a and 104b. Such a semiconductor device can be formed by an extrusion lamination method in which a film or a sheet immediately after being pulled out from a flat plane-shaped die of an extruder and a chip including a semiconductor element are pressured and bonded with a roller or the like. Here, a substrate formed from a conductive polymer is used for the both substrates 104a and 104b. It is to be noted that the chips 100 and 102 including a semiconductor element shown in FIGS. 1A and 1C can be applied instead of the chip 101 including a semiconductor element.

Figure 16B:
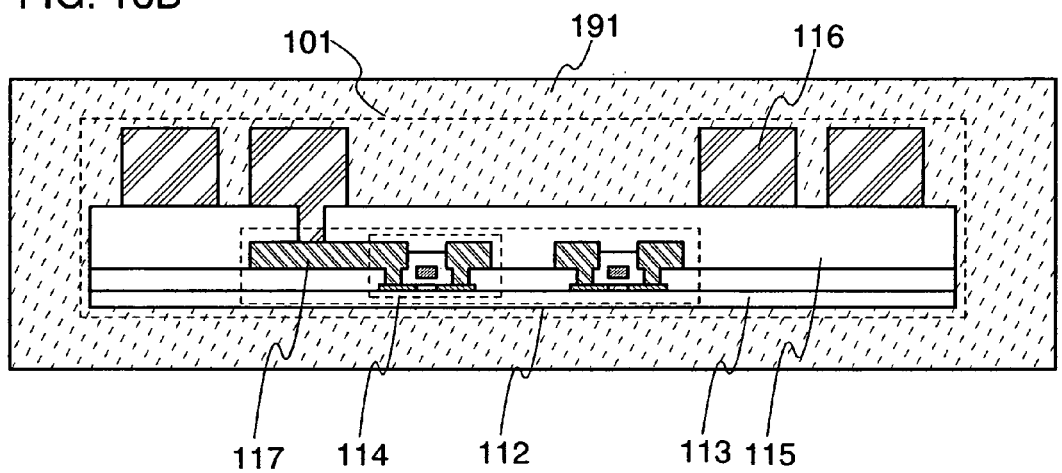

As a semiconductor device shown in FIG. 16B, a chip 101 including a semiconductor element may be provided inside a substrate 191 having a conductive polymer. Such a semiconductor device can be manufactured in such a way that the chip 101 including a semiconductor element is mixed into the substrate 191 having a conductive polymer when the substrate 191 is formed. Typically, cellulosic fiber and conductive polymer fiber are mixed to adjust pulp, and the chip 101 including a semiconductor element is mixed when making the pulp, whereby the semiconductor device can be manufactured.

As cellulosic fiber, wood pulp, linter pulp, or the like is given. As conductive polymer fiber, polythiophene fiber, polypyrrole fiber, polyaniline fiber, polyphenylene vinylene fiber, polyacene fiber, polyacetylene fiber, polyacrylonitrile fiber, poly-perinaphthalene fiber, or the like is given. In addition to the cellulosic fiber and the conductive polymer fiber, size (a blur inhibitor), a paper strength agent, or the like may be included. It is to be noted that the chips 100 and 102 including a semiconductor element shown in FIGS. 1A and 1C can be applied instead of the chip 101 including a semiconductor element.

As described above, in the semiconductor devices shown in FIGS. 16A and 16B and FIG. 17, used amount of the adhesive can be reduced. Therefore, a thickness of the semiconductor device can be thinned, and costs can be reduced.

Figure 2A:
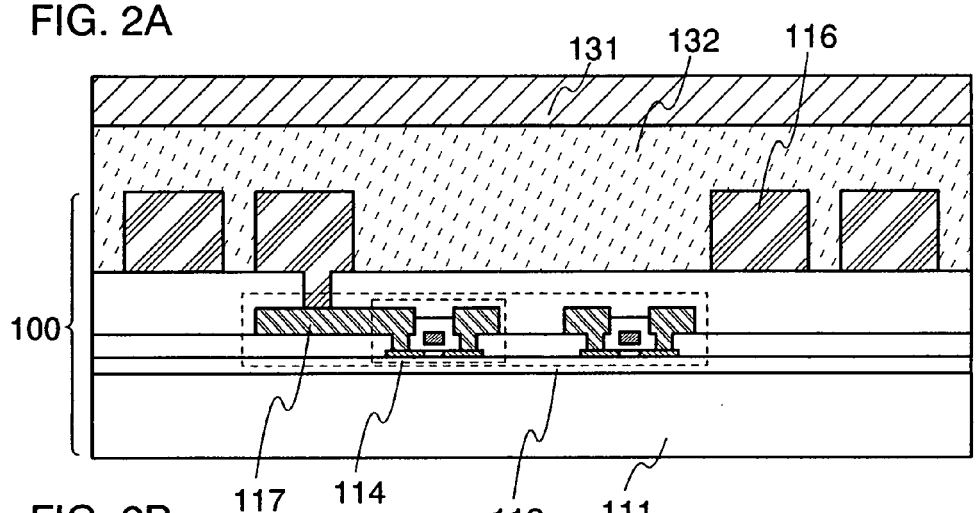
FIGS. 2A to 2C are cross-sectional views each showing a semiconductor device of the present invention.

As an adhesive that bonds a chip 100 including a semiconductor element and a substrate 131 as shown in FIG. 2A, an adhesive 132 formed from a conductive polymer can be used, of which volume resistivity is greater than or equal to $10^{-3}$ $\Omega\cdot$cm and less than or equal to $10^{12}$ $\Omega\cdot$cm, preferably greater than or equal to 1 $\Omega\cdot$cm and less than or equal to $10^9$ $\Omega\cdot$cm, further preferably, greater than or equal to $10^3$ $\Omega\cdot$cm and less than or equal to $10^6$ $\Omega\cdot$cm.

As the adhesive 132 formed from a conductive polymer, a composition in which a conductive polymer such as polythiophene, polypyrrole, polyaniline, polyphenylenevinylene, polyacene, polyacetylene, polyacrylonitrile, or poly-perinaphthalene and an adhesive organic resin such as an acrylic resin, an epoxy resin, a silicone resin, or a phenolic resin are mixed can be used.

As for the substrate 131, one cited for the substrate 111 can be appropriately used.

Figure 2B:
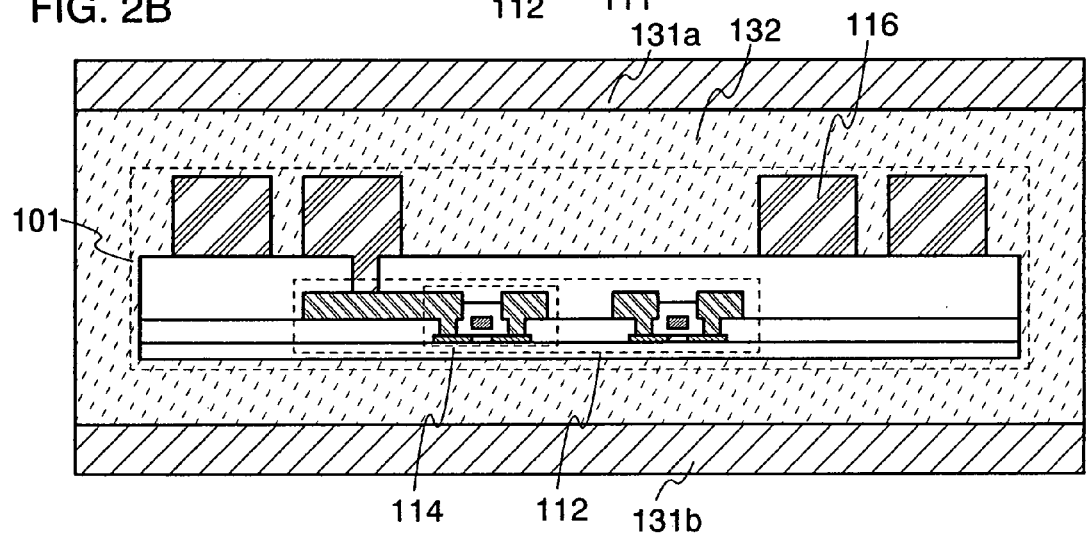

Similarly to the semiconductor device shown in FIG. 2A, a chip 101 including a semiconductor element without a substrate shown in FIG. 2B may be bonded between two substrates 131a and 131b with the use of an adhesive 132 formed from a conductive polymer. Here, since the adhesive 132 is provided to surround the chip 101 including a semiconductor element, breakdown and interference due to static electricity in all directions can be prevented.

In this case, as for the substrates 131a and 131b, one cited for the substrate 111 can be appropriately used.

Figure 2C:
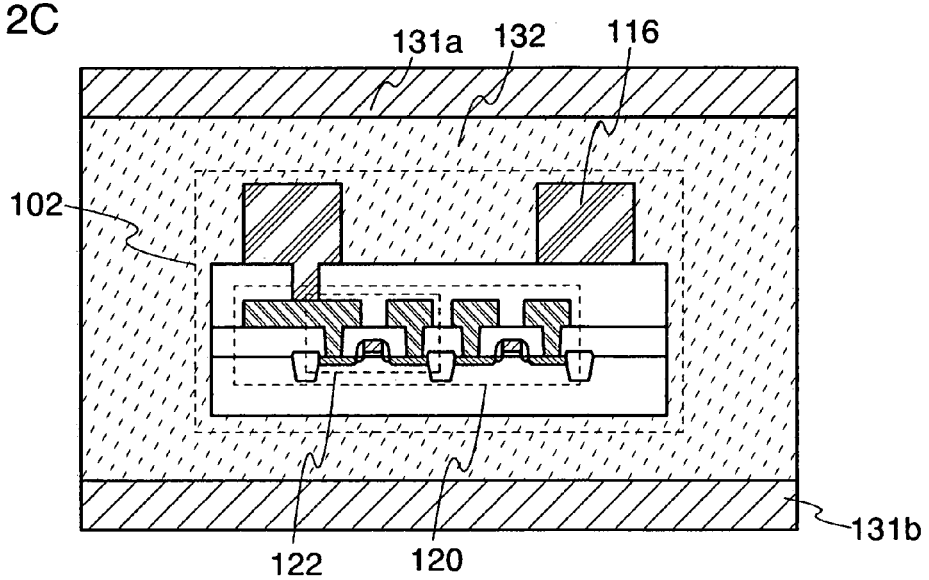

Similarly to the semiconductor devices shown in FIGS. 2A and 2B, a chip 102 including a semiconductor element that is made of a silicon chip with a silicon substrate as shown in FIG. 2C may be bonded between two substrates 131a and 131b with the use of an adhesive 132 formed from a conductive polymer. Here, since the adhesive 132 is provided to surround the chip 102 including a semiconductor element, breakdown and interference due to static electricity in all directions can be prevented.

Further, in FIGS. 2B and 2C, the substrate 131a may be attached to only one of surfaces of the chips 101 and 102 each including a semiconductor element with the use of the adhesive 132 formed from a conductive polymer as shown in FIG. 2A. Further, the substrate 131a may be attached to one of surfaces of the chips 101 and 102 each including a semiconductor element with the use of the adhesive 132 formed from a conductive polymer, and the substrate 111 may be attached to another surface of the chips 101 and 102 each including a semiconductor element with the use of the adhesive 103 shown in FIGS. 1A to 1C.

Moreover, in the semiconductor devices shown in FIGS. 2A to 2C, a substrate formed from a conductive polymer may be used for the substrates 131, 131a, and 131b as similar to the adhesive 132.

As described above, the semiconductor device of this embodiment mode has the chip including a semiconductor element provided with the substrate or the adhesive formed from a conductive polymer. Therefore, the semiconductor device of this embodiment mode can communicate with a reader/writer without interruption of an electric wave or an electromagnetic wave, and breakdown or interference in a semiconductor integrated circuit due to static electricity can be prevented.

Embodiment Mode 2

In this embodiment mode, a semiconductor device having a layer formed from a conductive polymer inside a chip including a semiconductor element will be explained with reference to FIGS. 3A and 3B.

The semiconductor device of this embodiment mode has a chip 100 including a semiconductor element.

Figure 3A:
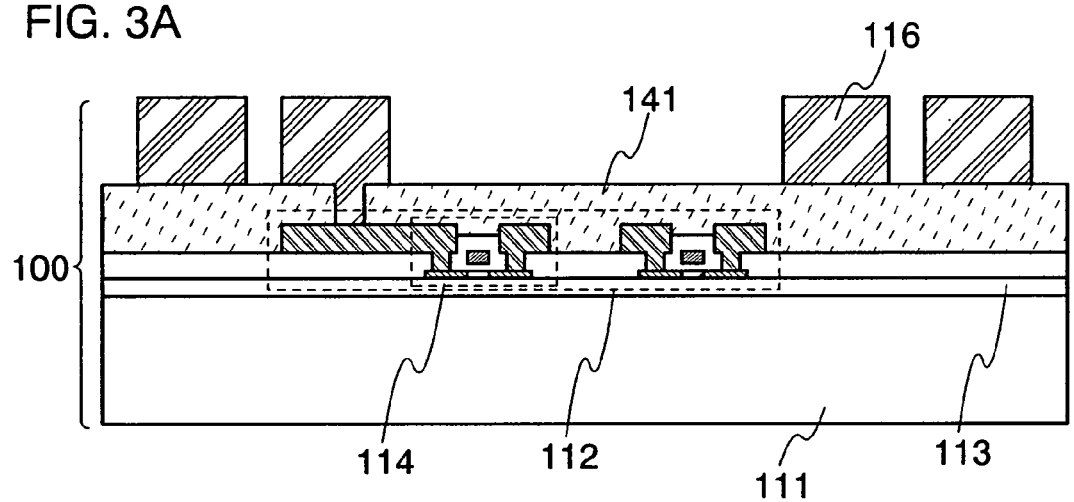
FIGS. 3A and 3B are cross-sectional views each showing a semiconductor device of the present invention.

As shown in FIG. 3A, the chip 100 including a semiconductor element of this embodiment mode has a substrate 111, a semiconductor integrated circuit 112 formed over the substrate 111 with an insulating layer 113 interposed therebetween, and an antenna 116 electrically connected to a thin film transistor 114 forming the semiconductor integrated circuit 112 through a layer 141. The layer 141 is provided to cover the semiconductor integrated circuit 112. The layer 141 is formed from a conductive polymer of which volume resistivity is greater than or equal to 1 Ω·cm and less than or equal to $10^9$ Ω·cm, preferably, greater than or equal to $10^3$ Ω·cm and less than or equal to 106 Ω·cm.

Figure 3B:
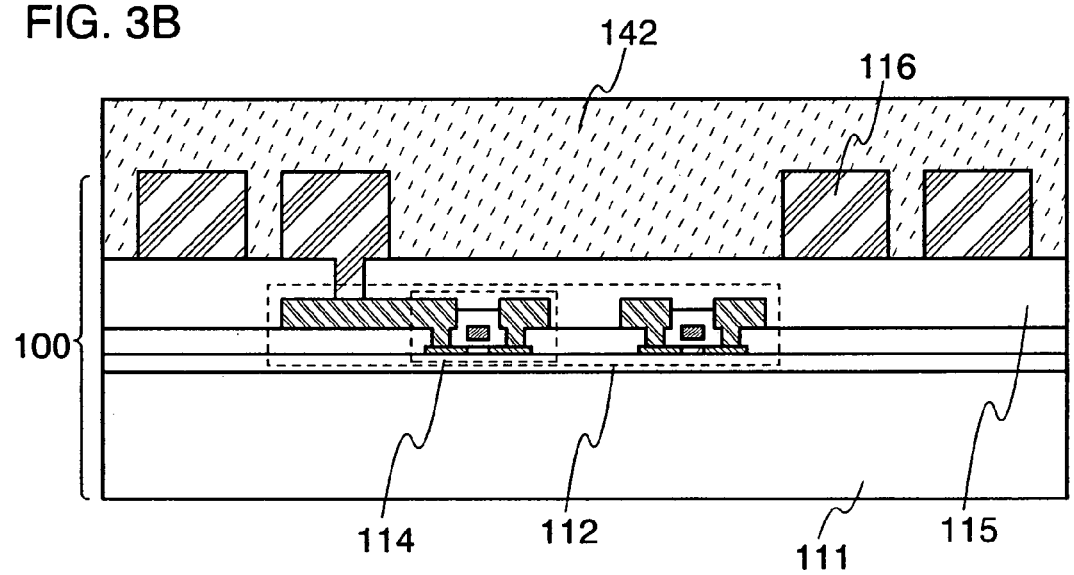

As shown in FIG. 3B, a chip 100 including a semiconductor element of this embodiment mode may have a substrate 111, a semiconductor integrated circuit 112 formed over a substrate 111 with the insulating layer 113 interposed therebetween, an antenna 116 electrically connected to a thin film transistor 114 forming the semiconductor integrated circuit 112 through an insulating layer 115, and a layer 142 covering the antenna 116 and the insulating layer 115. The layer 142 is formed from a conductive polymer of which volume resistivity is greater than or equal to 1 Ω·cm and less than or equal to $10^9$ Ω·cm, preferably, greater than or equal to $10^3$ Ω·cm and less than or equal to $10^6$ Ω·cm.

When a conductive polymer is used, of which volume resistivity is greater than or equal to 1 Ω·cm, preferably, greater than or equal to $10^3$ Ω·cm, wireless communication between the semiconductor device and a reader/writer can be performed without interruption of an electric wave or an electromagnetic wave. In addition, conductive layers in contact with the layer, which are different from each other, can be avoided to be short-circuited through the layer. Further, when a conductive polymer is used, of which volume resistivity is less than or equal to $10^9$ Ω·cm, preferably, less than or equal to $10^6$ Ω·cm, breakdown of a semiconductor device due to static electricity can be prevented.

In this embodiment mode, as the chip 100 including a semiconductor element, the chip including a semiconductor element that has the semiconductor integrated circuit 112 formed using the thin film transistor 114 over the substrate and the antenna as shown in FIG. 1A is shown. However, the present invention is not limited thereto. The present invention can be applied to the chip 101 including a semiconductor element without a substrate as shown in FIG. 1B and the chip 102 including a semiconductor element that is made of a silicon chip as shown in FIG. 1C.

Accordingly, the semiconductor device of this embodiment mode uses a conductive polymer in the layer forming a chip including a semiconductor element. Therefore, the semiconductor device of this embodiment mode can communicate with a reader/writer without interruption of an electric wave or an electromagnetic wave, and can prevent electrostatic breakdown. Moreover, the number of the substrates of the semiconductor device can be reduced. Therefore, the semiconductor device can be thinned, and costs can be reduced.

Embodiment Mode 3

In this embodiment mode, a semiconductor device in which a chip including a semiconductor element and a substrate provided with an antenna are bonded to each other will be explained with reference to FIGS. 4A to 4D, FIG. 5, and FIG. 6. The chip including a semiconductor element of this embodiment mode has no antenna, which is different from the chips 100 to 102 including a semiconductor element described in Embodiment Mode 1 or 2.

Figure 4A:
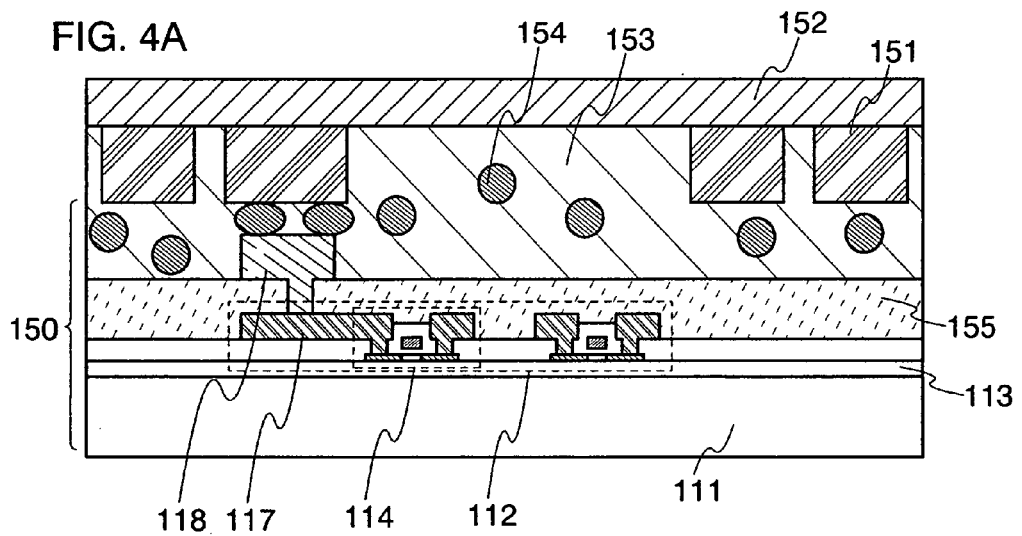
FIGS. 4A and 4B are cross-sectional views each showing a semiconductor device of the present invention.

As shown in FIG. 4A, in the semiconductor device of this embodiment mode, a chip 150 including a semiconductor element and a substrate 152 provided with an antenna 151 are bonded with an anisotropic conductive adhesive 153. A connection terminal 118 provided in the chip 150 including a semiconductor element and the antenna 151 are electrically connected through a conductive particle 154 dispersed in the anisotropic conductive adhesive 153.

As shown in FIG. 4A, the chip 150 including a semiconductor element of this embodiment mode has a substrate 111, a semiconductor integrated circuit 112 formed over the substrate 111 with an insulating layer 113 interposed therebetween, and the connection terminal 118 electrically connected to a thin film transistor 114 forming the semiconductor integrated circuit 112 through a layer 155. The layer 155 through which the connection terminal 118 and the thin film transistor 114 are connected is provided to cover the semiconductor integrated circuit 112. Further, the layer 155 is formed from a conductive polymer of which volume resistivity is greater than or equal to 1 Ω·cm and less than or equal to $10^9$ Ω·cm, preferably, greater than or equal to $10^3$ Ω·cm and less than or equal to $10^6$ Ω·cm.

As formation of the layer 155 through which the connection terminal 118 and the thin film transistor 114 are connected, a composition including a conductive polymer, such as polythiophene, polypyrrole, polyaniline, polyphenylenevinylene, polyacene, polyacetylene, polyacrylonitrile, or poly-perinaphthalene, of which volume resistivity is greater than or equal to 1 Ω·cm and less than or equal to $10^9$ Ω·cm, preferably, greater than or equal to $10^3$ Ω·cm and less than or equal to 106 Ω·cm, is applied and baked. In a case where the connection terminal 118 is covered with the composition including a conductive polymer when the composition is applied, the connection terminal 118 may be partially etched so as to be exposed after the composition is baked so that the layer 155 through which the connection terminal 118 and the thin film transistor 114 are connected is formed.

The connection terminal 118 can be formed in a similar way to the antenna 116.

The thin film transistor 114 and the antenna 151 are electrically connected through the connection terminal 118 and the conductive particle 154.

As the anisotropic conductive adhesive 153 that is an adhesive resin including the dispersed conductive particle 154 (the grain size is several nm to several tens μm, preferably, about 3 to 7 μm), an epoxy resin, a phenolic resin, or the like can be given. The conductive particle 154 is formed from one or more elements selected from gold, silver, copper, palladium, and platinum. The conductive particle 154 may have a multi-layer structure of these elements. Further, the conductive particle in which a thin film formed from one or more elements selected from gold, silver, copper, palladium, and platinum is formed over a surface of a particle formed from a resin may be used.

The connection terminal 118 and the antenna 151 may be connected by a method such as reflow treatment using an anisotropic conductive film or a solder bump instead of the anisotropic conductive adhesive 153. Alternatively, the connection terminal 118 and the antenna 151 may be connected by ultrasonic welding.

Figure 4B:
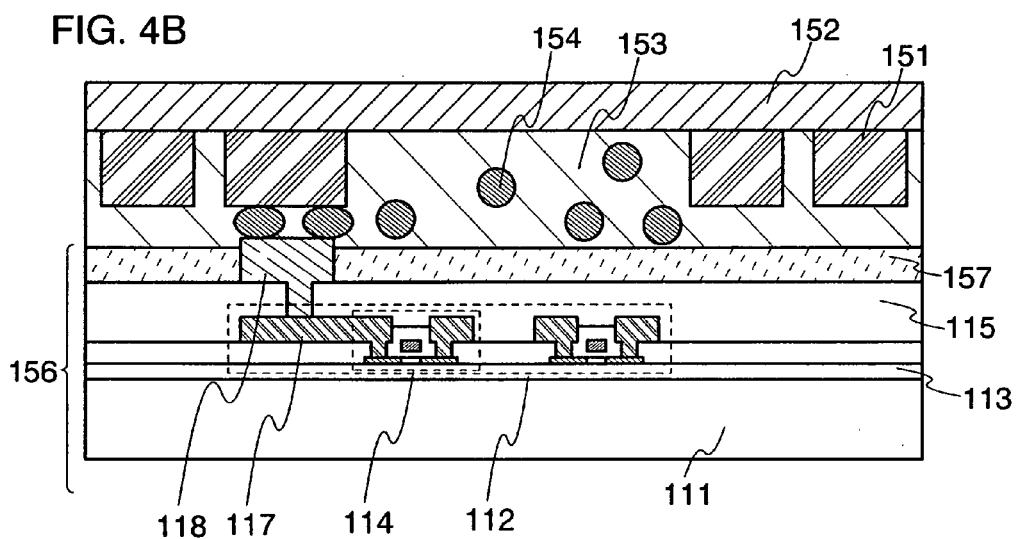

As shown in FIG. 4B, a chip 156 including a semiconductor element of this embodiment mode has a substrate 111, a semiconductor integrated circuit 112 formed over the substrate 111 with an insulating layer 113 interposed therebetween, a connection terminal 118 electrically connected to a thin film transistor 114 forming the semiconductor integrated circuit 112 through an insulating layer 115, and a layer 157 covering part of the connection terminal 118 and the insulating layer 115. The layer 157 covering part of the connection terminal 118 and the insulating layer 115 is provided to cover the semiconductor integrated circuit 112 and formed from a conductive polymer of which volume resistivity is greater than or equal to 1 Ω·cm and less than or equal to $10^9$ Ω·cm, preferably, greater than or equal to $10^3$ Ω·cm and less than or equal to $10^6$ Ω·cm.

The layer 157 covering part of the connection terminal 118 and the insulating layer 115 can be formed in a similar way to the layer 155 through which the connection terminal 118 and the thin film transistor 114 are connected.

The thin film transistor 114 and the antenna 151 are electrically connected through the connection terminal 118 and the conductive particle 154.

Figure 4C:
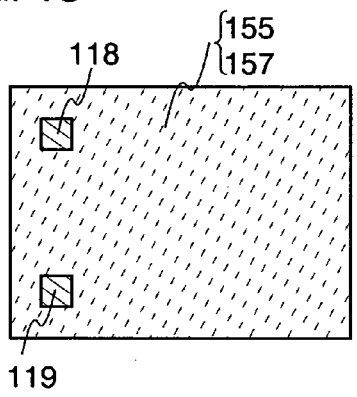
FIGS. 4C and 4D are top views each showing a semiconductor device thereof.
Figure 4D:
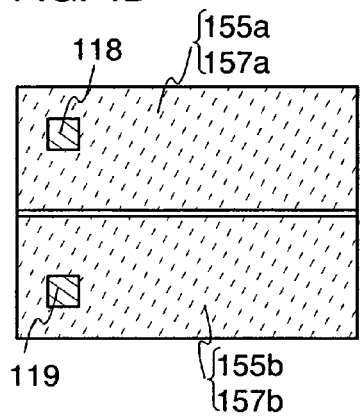

Here, FIGS. 4C and 4D show top views of the connection terminal 118 side of the chips 150 and 156 including a semiconductor element shown in FIGS. 4A and 4B. As shown in FIG. 4C, the layers 155 and 157 may be provided so as to be in contact with the connection terminal 118 and a connection terminal 119 that are different from each other. Alternatively, as shown in FIG. 4D, layers 155a, 155b, 157a, and 157b that are divided may be provided so as to be in contact with only one of the connection terminals 118 and 119 that are different from each other.

The layers 155 and 157 in the chips 150 and 156 including a semiconductor element of the semiconductor devices shown in FIGS. 4A to 4C are formed from a conductive polymer of which volume resistivity is greater than or equal to $10^{-3}$ Ω·cm and less than or equal to $10^{12}$ Ω·cm, preferably greater than or equal to 1 Ω·cm and less than or equal to $10^9$ Ω·cm, further preferably, greater than or equal to $10^3$ Ω·cm and less than or equal to $10^6$ Ω·cm. Therefore, short-circuited of the different connection terminals 118 and 119 can be avoided even if the layers 155 and 157 are in contact with the different connection terminals 118 and 119. The layers 155 and 157 in the chips 150 and 156 including a semiconductor element of the semiconductor devices shown in FIGS. 4A to 4D can protect the semiconductor integrated circuit 112 from damage due to static electricity from external.

Figure 5:
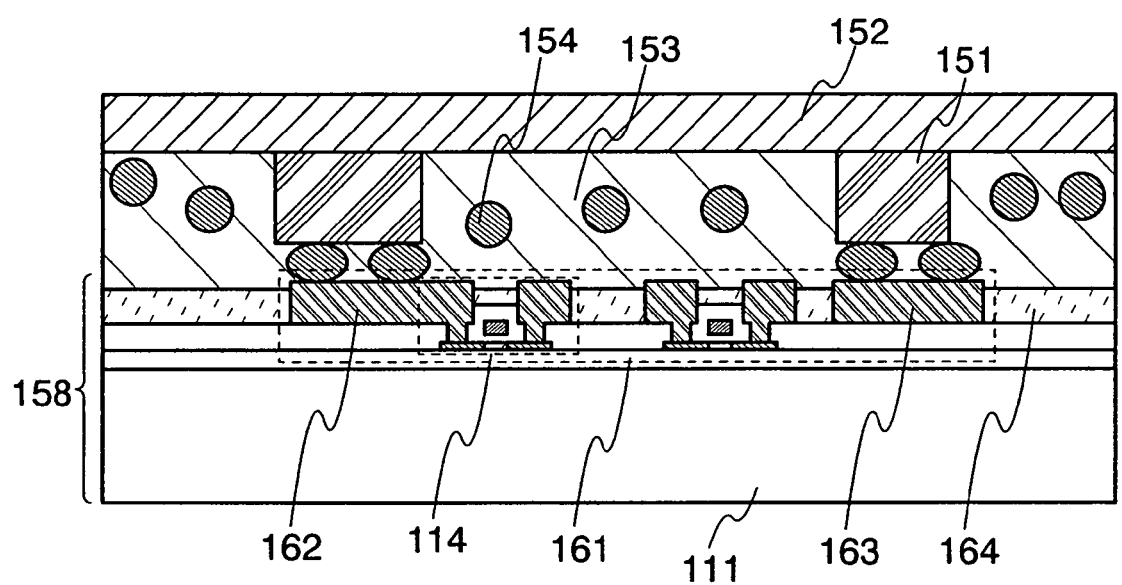
FIG. 5 is a cross-sectional view showing a semiconductor device of the present invention.

Instead of the structure in which the layer or the insulating layer 115 through which the connection terminal 118 and the thin film transistor 114 are connected is formed over the semiconductor integrated circuit 112 and a connection terminal is formed thereover as shown in FIGS. 4A and 4B, a chip 158 including a semiconductor element as shown in FIG. 5 may be used, which has connection terminals 162 and 163 in a semiconductor integrated circuit 161. In this case, a layer 164 covering part of a wiring of the semiconductor integrated circuit 161 is formed from a conductive polymer. The layer 164 covering part of a wiring of the semiconductor integrated circuit 161 is provided to cover the thin film transistor 114.

The layer 164 covering part of a wiring of the semiconductor integrated circuit 161 can be formed in a similar way to the layer 155 through which the connection terminal 118 and the thin film transistor 114 are connected.

The chip 158 including a semiconductor element and a substrate 152 provided with an antenna 151 are bonded with an anisotropic conductive adhesive 153 in which a conductive particle 154 is dispersed. The thin film transistor 114 and the antenna 151 are electrically connected through the connection terminals 162 and 163 and the conductive particle 154.

Figure 6:
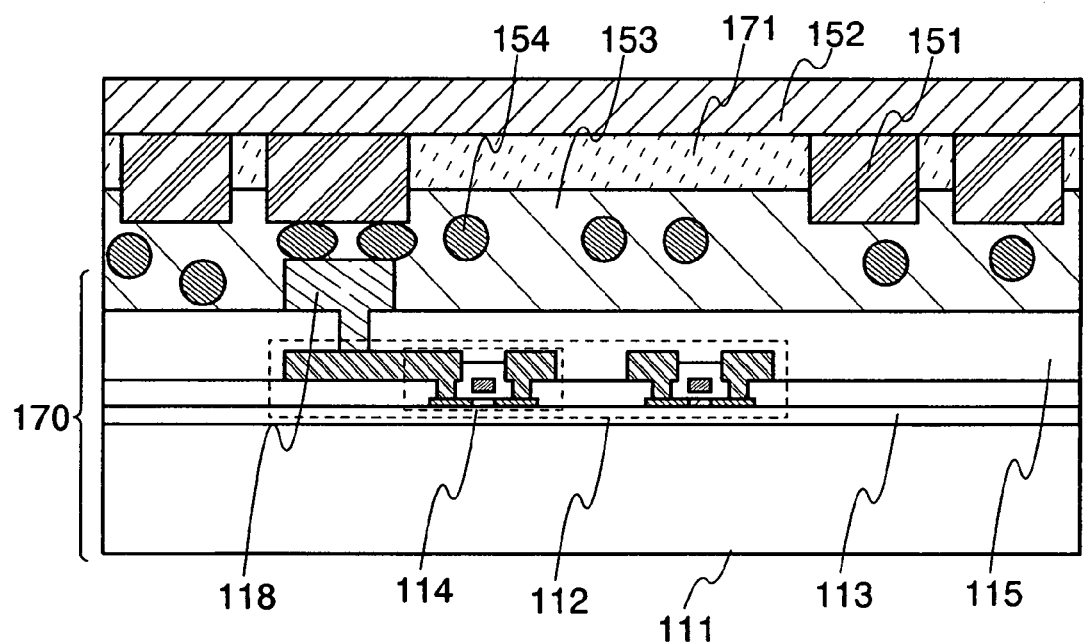
FIG. 6 is a cross-sectional view showing a semiconductor device of the present invention.

Further, a semiconductor device in which a chip 170 including a semiconductor element has no layer formed from a conductive polymer and a layer 171 covering part of an antenna 151 is formed on a substrate 152 provided with the antenna 151 may be used as shown in FIG. 6. The layer 171 is provided to cover a semiconductor integrated circuit 112 and formed from a conductive polymer of which volume resistivity is greater than or equal to 1 Ω·cm and less than or equal to $10^9$ Ω·cm, preferably, greater than or equal to $10^3$ Ω·cm and less than or equal to $10^6$ Ω·cm.

Typically, the chip 170 including a semiconductor element and the substrate 152 provided with the antenna 151 and the layer 171 covering part of the antenna are bonded with an anisotropic conductive adhesive 153. The chip 170 including a semiconductor element has a substrate 111, the semiconductor integrated circuit 112 formed over the substrate 111 with an insulating layer 113 interposed therebetween, and a connection terminal 118 connected to a thin film transistor 114 forming the semiconductor integrated circuit 112 through an insulating layer 115. Further, the thin film transistor 114 in the semiconductor integrated circuit 112 and the antenna 151 are electrically connected through a conductive particle 154 dispersed in the anisotropic conductive adhesive 153 and the connection terminal 118. The layer 171 covering part of the antenna 151 is formed from a conductive polymer of which volume resistivity is greater than or equal to 1 Ω·cm and less than or equal to $10^9$ Ω·cm, preferably, greater than or equal to $10^3$ Ω·cm and less than or equal to $10^6$ Ω·cm.

The layer 171 covering part of the antenna 151 can be formed in a similar way to the layer 155 through which the connection terminal 118 and the thin film transistor 114 are connected.

Further, as shown in FIG. 7A, a substrate 172 provided with an antenna 151 may be formed from a conductive polymer of which volume resistivity is greater than or equal to $10^{-3}$ Ω·cm and less than or equal to $10^{12}$ Ω·cm, preferably greater than or equal to 1 Ω·cm and less than or equal to $10^9$ Ω·cm, further preferably, greater than or equal to $10^3$ Ω·cm and less than or equal to $10^6$ Ω·cm.

Typically, a chip 170 including a semiconductor element and the substrate 172 provided with the antenna 151 are bonded with an anisotropic conductive adhesive 153. The chip 170 including a semiconductor element has a substrate 111, a semiconductor integrated circuit 112 formed over the substrate 111 with an insulating layer 113 interposed therebetween, and a connection terminal 118 connected to a thin film transistor 114 forming the semiconductor integrated circuit 112 through an insulating layer 115. The thin film transistor 114 in the semiconductor integrated circuit 112 and the antenna 151 are electrically connected through a conductive particle 154 dispersed in an anisotropic conductive adhesive 153 and the connection terminal 118. The substrate 172 provided with the antenna 151 is provided to cover the antenna 151 and the semiconductor integrated circuit 112 and is formed from a conductive polymer. As the substrate 172 formed from a conductive polymer, the substrate 104 shown in Embodiment Mode 1 can be appropriately used.

The above conductive polymer may be used for an anisotropic conductive adhesive 173 bonding a substrate 182 provided with an antenna 151 and a chip 170 including a semiconductor element as shown in FIG. 7B.

Typically, the chip 170 including a semiconductor element and the substrate 182 provided with the antenna 151 are bonded with the anisotropic conductive adhesive 173. The chip 170 including a semiconductor element has a substrate 111, a semiconductor integrated circuit 112 formed over the substrate 111 with an insulating layer 113 interposed therebetween, and a connection terminal 118 electrically connected to a thin film transistor 114 forming the semiconductor integrated circuit 112 through an insulating layer 115. The thin film transistor 114 in the semiconductor integrated circuit 112 and the antenna 151 are electrically connected through a conductive particle 154 dispersed in the anisotropic conductive adhesive 173 and the connection terminal 118. As the anisotropic conductive adhesive 173, the adhesive 132 formed from a conductive polymer cited in Embodiment Mode 1 can be appropriately used.

In this embodiment mode, as the chip including a semiconductor element, the chip 170 including a semiconductor element that has the semiconductor integrated circuit 112 formed over the substrate 111 with the use of the thin film transistor 114 is shown. However, the present invention is not limited thereto and can be applied to a chip including a semiconductor element without a substrate and a chip including a semiconductor element made of a silicon chip.

Figure 18A:
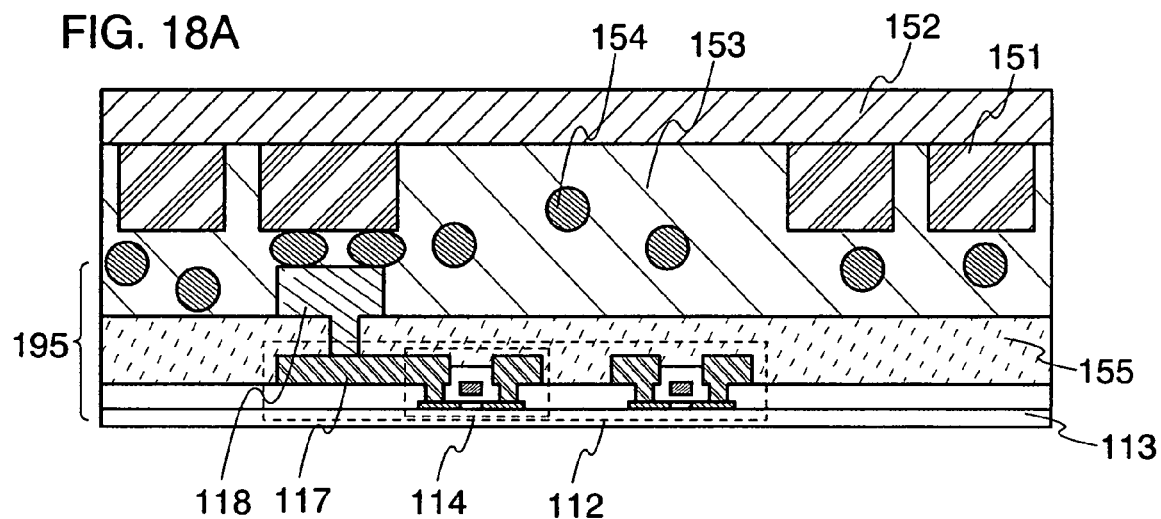
FIGS. 18A and 18B are cross-sectional views each showing a semiconductor device of the present invention.

As a typical example, an example is shown in which a chip 195 including a semiconductor element without a substrate and a substrate 152 provided with an antenna 151 are bonded with an anisotropic conductive adhesive 153, as shown in FIG. 18A. Further, a connection terminal 118 provided in the chip 195 including a semiconductor element and the antenna 151 are electrically connected through a conductive particle 154 dispersed in the anisotropic conductive adhesive 153.

The chip 195 including a semiconductor element without a substrate has a semiconductor integrated circuit 112 formed through an insulating layer 113 and the connection terminal 118 electrically connected to a thin film transistor 114 forming the semiconductor integrated circuit 112 through a layer 155. Further, the layer 155 through which the connection terminal 118 the thin film transistor 114 are connected is provided to cover the semiconductor integrated circuit 112 and formed from a conductive polymer.

It is to be noted that the semiconductor device shown in FIG. 18A is an example in which the chip including a semiconductor element of the semiconductor device shown in FIG. 4A is assumed as the chip 195 including a semiconductor element without a substrate. The chip 195 including a semiconductor element without a substrate can be applied to the semiconductor devices shown in FIG. 4B, FIG. 5, FIG. 6, and FIGS. 7A and 7B without being limited to the above.

Figure 18B:
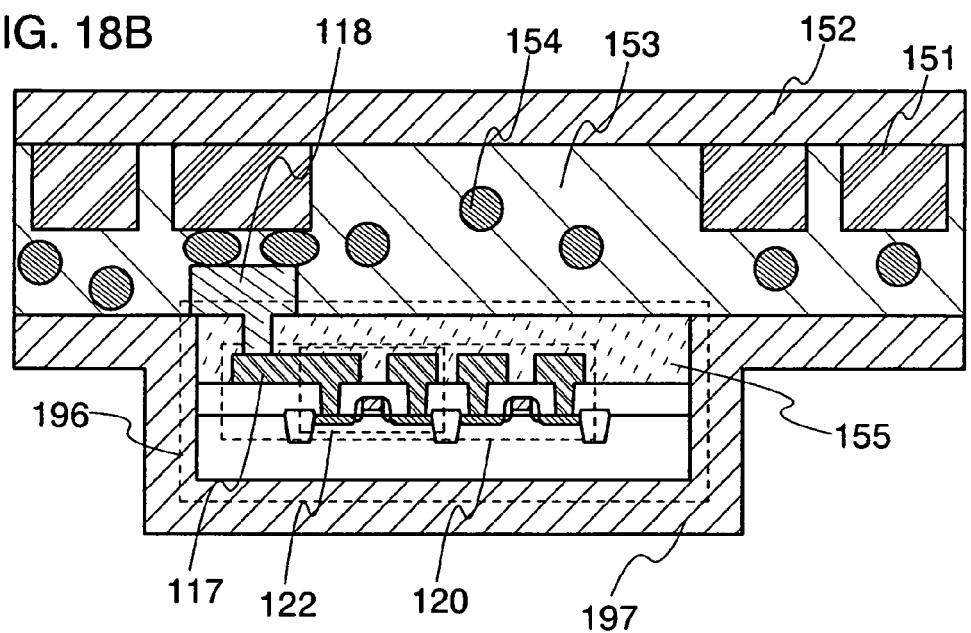

Further, as another typical example, an example is shown in which a chip 196 including a semiconductor element made of a silicon chip and a substrate 152 provided with an antenna 151 are bonded with an anisotropic conductive adhesive 153, as shown in FIG. 18B. A connection terminal 118 provided in the chip 196 including a semiconductor element and the antenna 151 are electrically connected with a conductive particle 154 dispersed in the anisotropic conductive adhesive 153. Moreover, the substrate 152 provided with the antenna and a flexible substrate 197 may be bonded with the anisotropic conductive adhesive 153. As the flexible substrate 197, the flexible substrate cited as the substrate 111 can be appropriately used.

It is to be noted that the semiconductor device shown in FIG. 18B is an example in which the chip including a semiconductor element of the semiconductor device shown in FIG. 4A is assumed as the chip 196 including a semiconductor element made of a silicon chip. The chip 196 including a semiconductor element made of a silicon chip can be applied to the semiconductor devices shown in FIG. 4B, FIG. 5, FIG. 6, and FIGS. 7A and 7B without being limited to the above.

As described above, in the semiconductor device of this embodiment mode, a conductive polymer is used for the layer provided in the chip including a semiconductor element, the substrate provided with the antenna, or the adhesive bonding the chip including a semiconductor element and the substrate provided with the antenna. Therefore, the semiconductor device of this embodiment mode can communicate with a reader/writer without interruption of an electric wave or an electromagnetic wave and can prevent electrostatic breakdown.

Embodiment Mode 4

In the semiconductor devices shown in Embodiment Modes 2 and 3, a layer formed from a conductive polymer or a substrate formed from a conductive polymer may be additionally provided on a side opposite to the layers 141, 142, 155, 157, 164, and 171 formed from a conductive polymer through the semiconductor integrated circuits 112 and 161. Further, a layer formed from a conductive polymer, a substrate formed from a conductive polymer, or an anisotropic conductive adhesive using a conductive polymer may be additionally provided on a side opposite to the substrate 172 or the anisotropic conductive adhesive 173 formed from a conductive polymer through the semiconductor integrated circuits 112 and 161. As a specific example, the semiconductor device of FIG. 3A is used for explanation; however, the semiconductor devices shown in FIG. 3B and FIGS. 4A to 4D, FIG. 5, FIG. 6, and FIGS. 7A and 7B can be applied.

Figure 8A:
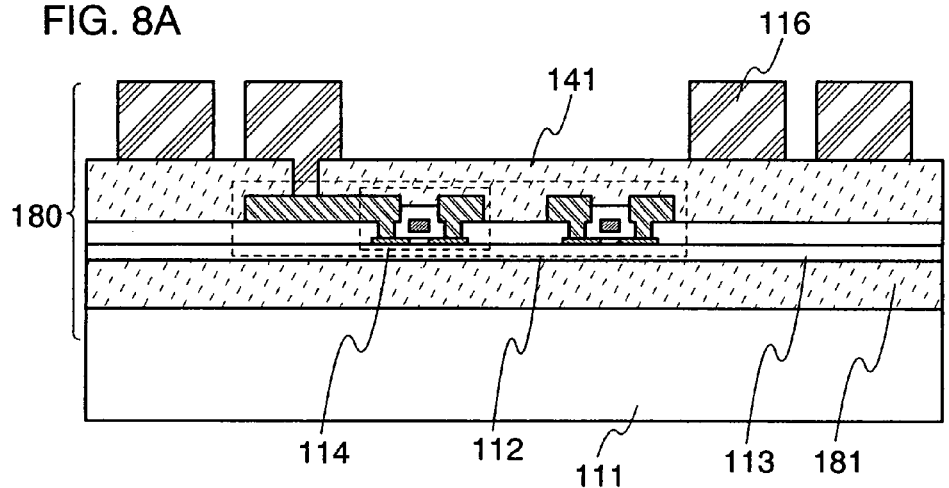
FIGS. 8A to 8C are cross-sectional views each showing a semiconductor device of the present invention.

In the chip 100 including a semiconductor element shown in FIG. 3A, a layer 181 formed from a conductive polymer may be provided between the substrate 111 and the insulating layer 113 as shown in FIG. 8A. Specifically, a chip 180 including a semiconductor element may be made, which has the substrate 111, the layer 181 formed from a conductive polymer provided over the substrate 111, the insulating layer 113 and the semiconductor integrated circuit 112 provided over the layer 181, and the antenna 116 electrically connected to the thin film transistor 114 forming the semiconductor integrated circuit 112 through the layer 141. The layers 141 and 181 are provided to cover the semiconductor integrated circuit 112 and formed from a conductive polymer of which volume resistivity is greater than or equal to $10^{-3}$ $\Omega\cdot$cm and less than or equal to $10^{12}$ $\Omega\cdot$cm, preferably greater than or equal to 1 $\Omega\cdot$cm and less than or equal to $10^9$ $\Omega\cdot$cm, further preferably, greater than or equal to $10^3$ $\Omega\cdot$cm and less than or equal to $10^6$ $\Omega\cdot$cm.

As a manufacturing method of a semiconductor device having such a structure, there is a method in which the layer 181 is formed over the substrate 111, the insulating layer 113 is formed over the layer 181, and the semiconductor integrated circuit 112, the layer 141 formed from a conductive polymer, and the antenna 116 are formed over the insulating layer 113.

The layer 181 is formed from a conductive polymer of which volume resistivity is greater than or equal to $10^{-3}$ $\Omega\cdot$cm and less than or equal to $10^{12}$ $\Omega\cdot$cm, preferably greater than or equal to 1 $\Omega\cdot$cm and less than or equal to $10^9$ $\Omega\cdot$cm, further preferably, greater than or equal to $10^3$ $\Omega\cdot$cm and less than or equal to $10^6$ $\Omega\cdot$cm. Typically, a composition including polythiophene, polypyrrole, polyaniline, polyphenylenevinylene, polyacene, polyacetylene, polyacrylonitrile, poly-perinaphthalene, or the like is applied and baked for formation of the layer 181.

Further, the semiconductor integrated circuit 112, the layer 141 formed from a conductive polymer, and the antenna 116 formed over the insulating layer 113 may be bonded to the substrate 111 with an adhesive formed from a conductive polymer of which volume resistivity is greater than or equal to $10^{-3}$ $\Omega\cdot$cm and less than or equal to $10^{12}$ $\Omega\cdot$cm, preferably greater than or equal to 1 $\Omega\cdot$cm and less than or equal to $10^9$ $\Omega\cdot$cm, further preferably, greater than or equal to $10^3$ $\Omega\cdot$cm and less than or equal to $10^6$ Ω·cm. As a result, the adhesive formed from a conductive polymer becomes the layer 181. As for the adhesive formed from a conductive polymer, the adhesive 132 formed from a conductive polymer shown in Embodiment Mode 1 can be applied.

Figure 8B:
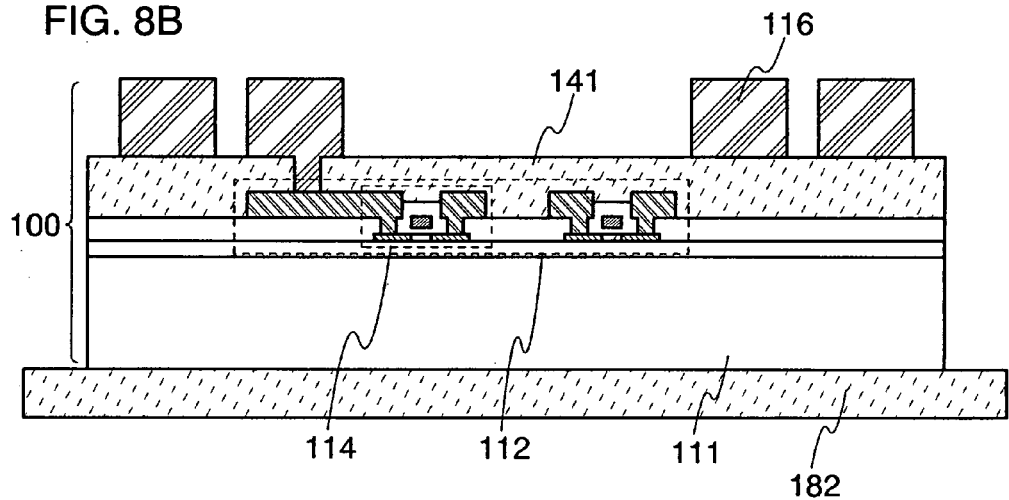

Further, in the chip 100 including a semiconductor element shown in FIG. 3A, a substrate 182 formed from a conductive polymer of which volume resistivity is greater than or equal to $10^{-3}$ Ω·cm and less than or equal to $10^{12}$ Ω·cm, preferably greater than or equal to 1 Ω·cm and less than or equal to $10^9$ Ω·cm, further preferably, greater than or equal to $10^3$ Ω·cm and less than or equal to $10^6$ Ω·cm may be provided on a surface of the substrate 111 as shown in FIG. 8B. Specifically, a chip 100 including a semiconductor element may be made, which has the substrate 182 formed from a conductive polymer, the substrate 111 provided over the substrate 182, the insulating layer 113 and the semiconductor integrated circuit 112 provided over the substrate 111, and the antenna 116 electrically connected to the thin film transistor 114 forming the semiconductor integrated circuit 112 through the layer 141. It is to be noted that the substrate 182 and the layer 141 are formed from a conductive polymer.

Figure 8C:
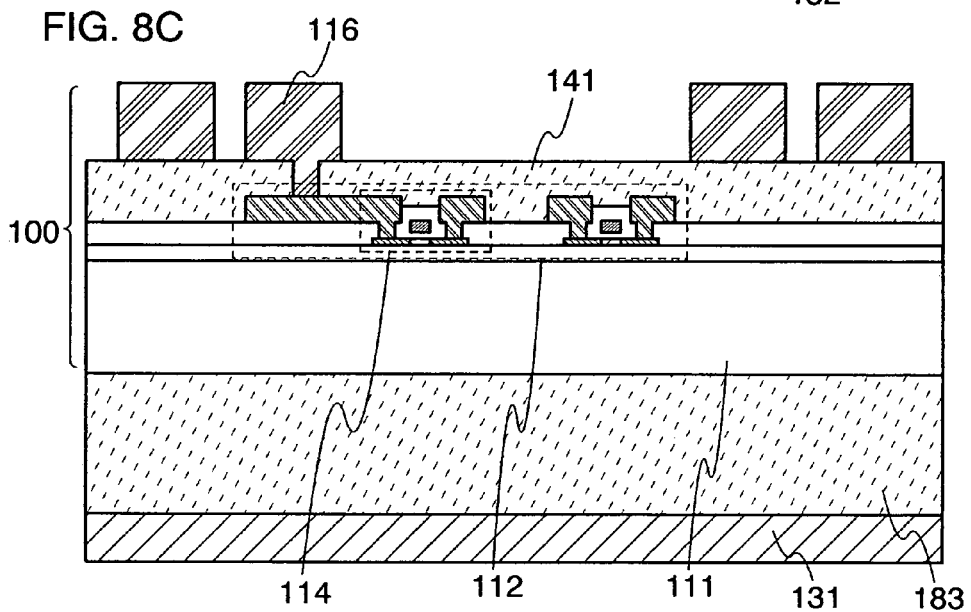

Furthermore, in the chip 100 including a semiconductor element shown in FIG. 3A, a substrate 131 may be provided with the use of an adhesive 183 formed from a conductive polymer of which volume resistivity is greater than or equal to 1 Ω·cm and less than or equal to $10^9$ Ω·cm, preferably greater than or equal to 1 Ω·cm and less than or equal to $10^9$ Ω·cm further preferably, greater than or equal to $10^3$ Ω·cm and less than or equal to $10^6$ Ω·cm on a surface of the substrate 111 as shown in FIG. 8C. Specifically, a chip 100 including a semiconductor element may be made, which has the substrate 131, the substrate 111 bonded over the substrate 131 with the adhesive 183, the insulating layer 113 and the semiconductor integrated circuit 112 provided over the substrate 111, and the antenna 116 electrically connected to the thin film transistor 114 forming the semiconductor integrated circuit 112 through the layer 141. It is to be noted that the adhesive 183 and the layer 181 are formed from a conductive polymer.

In the semiconductor device of this embodiment mode, the semiconductor integrated circuit is interposed with the substrate, layer, or adhesive formed from a conductive polymer. Therefore, the semiconductor device of this embodiment mode can avoid breakdown of the semiconductor integrated circuit and interference of information transmission and reception due to static electricity from two directions.

Embodiment 1

In this embodiment, a manufacturing process of a semiconductor device capable of transmitting data wirelessly will be explained with reference to FIGS. 9A to 9E, FIGS. 10A to 10D, and FIGS. 1A to 11C.

Figure 9A:
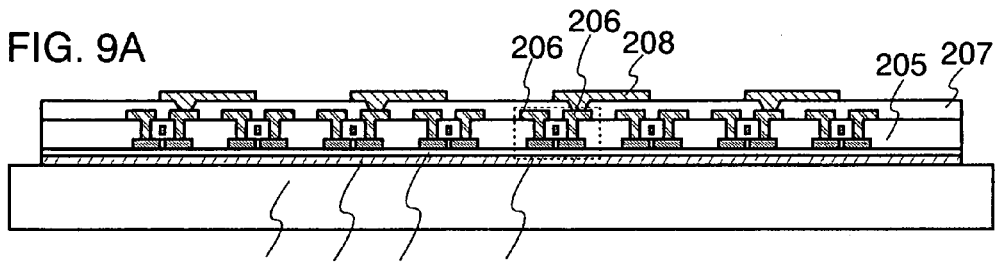
FIGS. 9A to 9E are cross-sectional views each showing a step for manufacturing a semiconductor device of the present invention.

As shown in FIG. 9A, a peeling layer 202 is formed over a substrate 201, an insulating layer 203 is formed over the peeling layer 202, a thin film transistor 204 and an interlayer insulating layer 205 that insulates a conductive layer forming the thin film transistor 204 are formed over the insulating layer 203, and a source electrode and drain electrode 206 connected to a semiconductor layer of the thin film transistor 204 are formed. Then, an insulating layer 207 covering the thin film transistor 204, the interlayer insulating layer 205, and the source electrode and drain electrode 206 is formed, and a conductive layer 208 connected to the source electrode or drain electrode 206 through the insulating layer 207 is formed.

As for the substrate 201, a glass substrate, a quartz substrate, a metal substrate, or a stainless steel substrate with an insulating layer formed over one of the surfaces, a plastic substrate that has enough heat resistance to withstand the treatment temperature of this step, or the like is used. Since the aforementioned substrate 201 is not limited in size or shape, a rectangular substrate with a length of 1 meter or more on one side, for example, can be used to drastically increase productivity. This point is superior to that of a circular silicon substrate.

The peeling layer 202 is formed by a sputtering method, a plasma CVD method, a coating method, a printing method, or the like to be a single layer or a stacked layer made from an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si); an alloy material containing the element as its main component; or a compound material containing the element as its main component. The crystalline structure of a layer containing silicon may be amorphous, microcrystalline, or polycrystalline.

When the peeling layer 202 has a single layer structure, a tungsten layer, a molybdenum layer, or a layer containing a mixture of tungsten and molybdenum is preferably formed. Alternatively, a layer containing tungsten oxide or tungsten oxynitride, a layer containing molybdenum oxide or molybdenum oxynitride, or a layer containing an oxide of a mixture of tungsten and molybdenum or an oxynitride of a mixture of tungsten and molybdenum is formed. It is to be noted that the mixture of tungsten and molybdenum corresponds to an alloy of tungsten and molybdenum.

When the peeling layer 202 has a stacked layer structure, a tungsten layer, a molybdenum layer, or a layer containing a mixture of tungsten and molybdenum is preferably formed as a first layer. An oxide of tungsten, an oxide of molybdenum, or an oxide of a mixture of tungsten and molybdenum; a nitride of tungsten, a nitride of molybdenum, or a nitride of a mixture of tungsten and molybdenum; an oxynitride of tungsten, an oxynitride of molybdenum, or an oxynitride of a mixture of tungsten and molybdenum; or a nitride oxide of tungsten, a nitride oxide of molybdenum, or a nitride oxide of a mixture of tungsten and molybdenum is preferably formed as a second layer.

When a stacked layer structure of a layer containing tungsten and a layer containing tungsten oxide is formed as the peeling layer 202, the layer containing tungsten is formed, and an insulating layer formed from oxide is formed thereover. Then, a layer containing tungsten oxide is formed in an interface between the tungsten layer and the insulating layer, which may be utilized. Moreover, a surface of the layer containing tungsten may be subjected to thermal oxidation treatment, oxygen plasma treatment, $N_2O$ plasma treatment, treatment using a solution having strong oxidizability such as ozone water, treatment using water to which hydrogen is added, or the like, whereby the layer containing tungsten oxide is formed. A case of forming a layer containing tungsten nitride, a layer containing tungsten oxynitride, or a layer containing tungsten nitride oxide is similar to the above. After the layer containing tungsten is formed, a silicon nitride layer, a silicon oxynitride layer, or a silicon nitride oxide layer may be formed thereover.

Tungsten oxide is represented by WOx where x is in the range of $2 \leq x \leq 3$. The x may be 2 ($WO_2$), 2.5 ($W_2O_5$), 2.75 ($W_4O_{11}$), 3 ($WO_3$), or the like.

Although the peeling layer 202 is formed so as to be in contact with the substrate 201 in accordance with the above step, the present invention is not limited to this step. An insulating layer to be a base may be formed so as to be in contact with the substrate 201, and the peeling layer 202 may be provided so as to be in contact with the insulating layer.

The insulating layer 203 is formed using an inorganic compound by a sputtering method, a plasma CVD method, a coating method, a printing method, or the like to be a single layer or a stacked layer. As a typical example of an inorganic compound, oxidized silicon or nitrided silicon can be given.

Moreover, the insulating layer 203 may be formed so as to have a stacked layer structure. For example, layers may be stacked using an inorganic compound. Typically, silicon oxide, silicon nitride oxide, and silicon oxynitride may be stacked to form the insulating layer 203.

The thin film transistor 204 includes a semiconductor layer having a source region, a drain region, and a channel formation region; a gate insulating layer; and a gate electrode.

The semiconductor layer is formed from a semiconductor having a crystalline structure, and a non-single crystalline semiconductor or a single crystalline semiconductor can be used. In particular, a crystalline semiconductor that is crystallized by heat treatment or a crystalline semiconductor that is crystallized by combining heat treatment and irradiation of laser light is preferably applied. In a heat treatment, a crystallization method can be applied using a metal element such as nickel that operates to promote crystallization of a silicon semiconductor. Further, by heating during the crystallization step of the silicon semiconductor, a surface of the peeling layer can be oxidized to form a metal oxidized layer in the interface between the peeling layer 202 and the insulating layer 203. Furthermore, during an activation step of an impurity added to the semiconductor layer or a dehydrogenation step, a surface of the peeling layer can be oxidized to form a metal oxidized layer in the interface between the peeling layer 202 and the insulating layer 203. The dehydrogenation step is a step in which heating is performed before irradiating an amorphous semiconductor with laser light to discharge hydrogen contained in the amorphous semiconductor in a case where the amorphous semiconductor is irradiated with laser light to be crystallized.

When crystallization is performed by irradiation of laser light in addition to heat treatment, the crystallization can be performed by using continuous wave laser light or ultra short pulsed laser light with a repetition rate of 10 MHz or higher and a pulse width of 1 nano-second or shorter, preferably 1 to 100 pico-seconds, in such a way that the melting zone in which the crystalline semiconductor is melted is moved continuously in a direction of irradiation of the laser light. By such a crystallization method, a crystalline semiconductor that has a large grain size with a crystal grain boundary extending in one direction can be obtained. By matching a carrier drifting direction to the direction in which the crystal grain boundary is extended, the electric field effect mobility of the transistor can be increased. For example, a mobility of 400 cm$^2$/V·sec or higher can be achieved.

When a crystallization process at a heat-resistance temperature (approximately 600° C.) or lower of the glass substrate is used for the above crystallization step, a glass substrate having a large size can be used. Therefore, a large quantity of semiconductor devices can be manufactured per substrate, and costs can be reduced.

Further, the semiconductor layer may be formed by performing a crystallization step by heating at the temperature of heat resistance of the glass substrate or more. Typically, a quartz substrate is used for the substrate 201 with an insulating surface, and an amorphous or microcrystalline semiconductor is heated at 700° C. or more, whereby the semiconductor layer is formed. As a result, a semiconductor having high crystallinity can be formed. Therefore, a thin film transistor of which properties such as response speed and mobility are favorable and which is capable of high speed operation can be provided.

The gate insulating layer is formed from an inorganic insulator such as silicon oxide or silicon oxynitride.

The gate electrode can be formed from a polycrystalline semiconductor to which a metal or an impurity of one conductivity type is added. When a metal is used, tungsten (W), molybdenum (Mo), titanium (Ti), tantalum (Ta), aluminum (Al), or the like can be used. Metal nitride in which metal is nitrided can be also used. Alternatively, the gate electrode may have a structure in which a first layer made from the metal nitride and a second layer made from the metal are stacked. With the stacked layer structure, an edge portion of the first layer may be projected beyond an edge portion of the second layer. At this time, by forming the first layer from a metal nitride, a barrier metal can be obtained. In other words, the metal of the second layer can be prevented from diffusing into the gate insulating layer or into the semiconductor layer that is provided in the lower part of the gate insulating layer.

Various structures such as a single drain structure, an LDD (lightly-doped drain) structure, and a gate-overlapped drain structure can be applied to the thin film transistor that is formed by combining the semiconductor layer, the gate insulating layer, the gate electrode, and the like. Here, a thin film transistor having a single drain structure can be employed. Moreover, a multi-gate structure where transistors, to which a gate voltage having the same potential is applied equally, are connected serially, a dual-gate structure where the semiconductor layer is sandwiched by the gate electrode, an inversely staggered thin film transistor where the gate electrode is formed over the insulating layer 203 and the gate insulating layer and the semiconductor layer are formed thereover, or the like can be applied.

The source electrode and drain electrode 206 are preferably formed by combining a low-resistance material such as aluminum (Al), and a barrier metal using a metal material that has a high melting point such as titanium (Ti) or molybdenum (Mo) to have a stacked-layer structure of titanium (Ti) and aluminum (Al), a stacked-layer structure of molybdenum (Mo) and aluminum (Al), or the like.

Polyimide, acryl, or a siloxane polymer is applied and baked, whereby the interlayer insulating layer 205 and the insulating layer 207 can be formed. The interlayer insulating layer 205 and the insulating layer 207 may be formed using an inorganic compound by a sputtering method, a plasma CVD method, a coating method, a printing method, or the like to be a single layer or a stacked layer. As a typical example of an inorganic compound, silicon oxide, silicon nitride, or silicon oxynitride can be given.

Furthermore, a semiconductor element of any structure may be provided instead of the thin film transistor 204, as long as the semiconductor element serves as a switching element. As a typical example of a switching element, MIM (Metal-Insulator-Metal), a diode, or the like can be given.

Figure 9B:
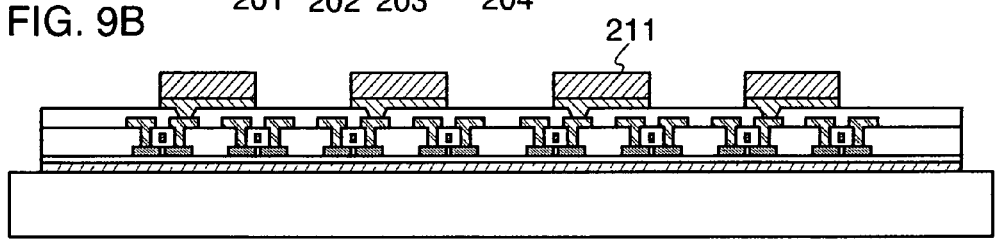

Next, as shown in FIG. 9B, a conductive layer 211 is formed over the conductive layer 208. Here, a composition that includes gold particles is printed by a printing method, and then, heating is performed at 200° C. for 30 minutes to bake the composition, whereby the conductive layer 211 is formed.

Figure 9C:
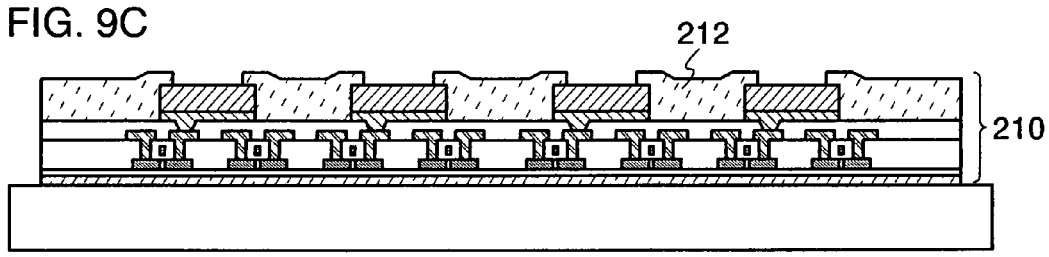

Subsequently, as shown in FIG. 9C, a layer 212 for covering the insulating layer 207 and an edge portion of the conductive layer 211 is formed from a conductive polymer. Here, the layer 212 covering the insulating layer 207 and the edge portion of the conductive layer 211 is formed using an epoxy resin and polyaniline. After a composition of an epoxy resin and polyaniline is applied by a spin coating method, the composition is heated at 160° C. for 30 minutes. Then, the layer at a portion where the conductive layer 211 is covered is removed so as to expose the conductive layer 211, and the layer 212 is formed, as well, with a thickness of 1 to 20 μm, preferably, 5 to 10 μm. Here, a stacked body including the insulating layer 203 to the layer 212 is referred to as an element formation layer 210.

Figure 9D:
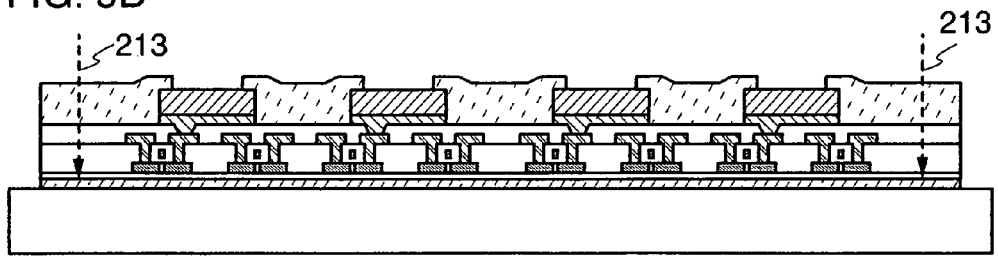
Figure 9E:
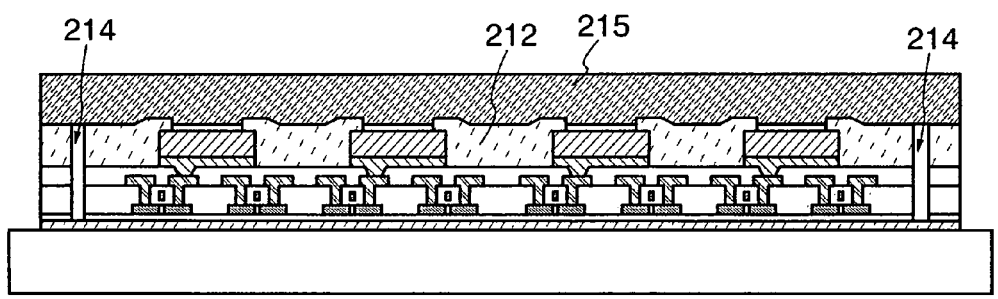

Then, as shown in FIG. 9D, in order to perform a subsequent peeling step easily, the insulating layers 203, 205, and 207 and the layer 212 are irradiated with laser light 213 to form an opening 214 as shown in FIG. 9E. Subsequently, an adhesive 215 is attached to the layer 212. As the laser light used for forming the opening 214, laser light having a wavelength that is absorbed by the insulating layers 203, 205, and 207 or the layer 212 is preferably used. Typically, laser light in the UV region, the visible region, or the infrared region is appropriately selected for irradiation.

As a laser oscillator capable of oscillating such laser light, an excimer laser oscillator such as a KrF, ArF, or XeCl laser oscillator; a gas laser oscillator such as a He, He—Cd, Ar, He—Ne, HF, or $CO_2$ laser oscillator; a solid laser oscillator such as a crystal laser oscillator in which a crystal such as YAG, $GdVO_4$, $YVO_4$, YLF, or $YAlO_3$ is doped with Cr, Nd, Er, Ho, Ce, Co, Ti, or Tm, a glass laser oscillator, or a ruby laser oscillator; or a semiconductor laser oscillator such as a GaN, GaAs, GaALAs, or InGaAsP laser oscillator can be used. In the solid laser oscillator, the fundamental wave to the fifth harmonic wave may be appropriately used. As a result, the insulating layers 203, 205, and 207 and the layer 212 are melted by absorbing the laser light laser light to form the opening.

By eliminating the step of irradiating the insulating layers 203, 205, and 207 and the layer 212 with laser light, throughput can be improved.

Figure 10A:
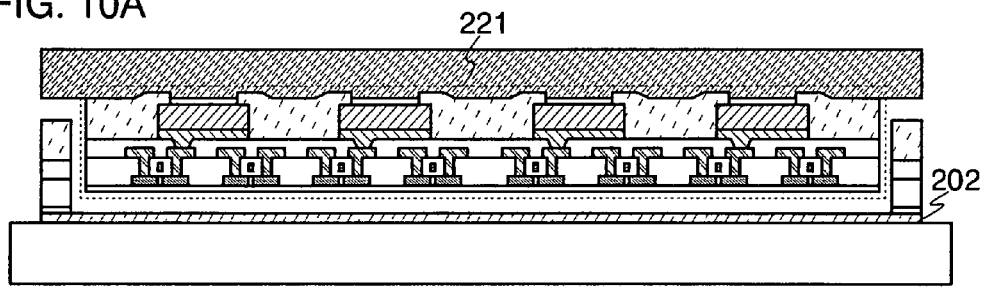
FIGS. 10A to 10D are cross-sectional views each showing a step for manufacturing a semiconductor device of the present invention.

Next, as shown in FIG. 10A, a part 221 of the element formation layer is peeled from the substrate 201 having the peeling layer by a physical means by dividing a metal oxide layer formed in the interface between the peeling layer 202 and the insulating layer 203. The physical means refers to a dynamic means or a mechanical means, which changes some dynamic energy (mechanical energy). The typical physical means refers to mechanical power addition (for example, peeling by a human hand or grip tool or separation treatment by rolling a roller).

In the above peeling step, there are a layer that does not contract in heat treatment, a layer that contracts in heat treatment, and a layer that has an intermediate state thereof. The above peeling step has a feature in that excessive stress is given to the intermediate layer or a near-field region thereof by heat treatment on completion of the peeling step or during the peeling step, and then peeling can be performed in the intermediate layer or the near-field region thereof by addition of stimulation.

In this embodiment, the layer that does not contract in heat treatment is the peeling layer 202, the layer that contracts in heat treatment is the insulating layer 203 or the layer 212, and the layer in the intermediate state of the layer that does not contract and the layer that contracts in heat treatment is the layer formed in the interface of the peeling layer 202 and the insulating layer 203. As typical examples, a tungsten layer is used for the peeling layer 202, oxidized silicon or nitrided silicon is used for the insulating layer 203, and a composition of an epoxy resin and polyaniline is used for the layer 212. Consequently, the peeling layer 202 does not contract, but the insulating layer 203 and the layer 212 contract in heat treatment such as crystallization of the amorphous silicon film, activation of an impurity, or dehydrogenation. In addition, a tungsten oxide layer ($WOx$ $2 \leq x \leq 3$) is formed in the interface of the peeling layer 202 and the insulating layer 203. Since the tungsten oxide layer is brittle, the layer is easily separated by the above physical means. As a result, the portion 221 of the element formation layer can be peeled from the substrate 201 by the above physical means.

In this embodiment, a method in which the metal oxide film is formed between the peeling layer and the insulating layer and the element formation layer 210 is peeled by a physical means by dividing the metal oxide film is used; however, the present invention is not limited thereto. A method can be used in which, by using a substrate that has a light transmitting property for the substrate and using an amorphous silicon layer containing moisture for the peeling layer, irradiation of laser light from the substrate side is performed to vaporize moisture contained in the amorphous silicon layer after the step of FIG. 9E, and peeling between the substrate and the peeling layer is performed.

Further, after the step of FIG. 9E, a method for removing the substrate by mechanically grinding the substrate or a method for removing the substrate using a solution for dissolving a substrate, such as a HF solution, can be used. In this case, the peeling layer may be unused.

In FIG. 9E, the following method can be used: a fluoride halogen gas such as $NF_3$, $BrF_3$, or $ClF_3$ is introduced into the opening 214 before the adhesive 215 is attached to the layer 212; after the peeling layer is etched with a fluoride halogen gas and removed, the adhesive 215 is attached to the layer 212; and the element formation layer 210 is peeled from the substrate.

In FIG. 9E, the following method can also be used: a fluoride halogen gas such as $NF_3$, $BrF_3$, or $ClF_3$ is introduced into the opening 214 before the adhesive 215 is attached to the layer 212; after part of the peeling layer is etched with a fluoride halogen gas and removed, the adhesive 215 is attached to the layer 212; and the element formation layer 210 is peeled from the substrate by a physical means.

Figure 10B:
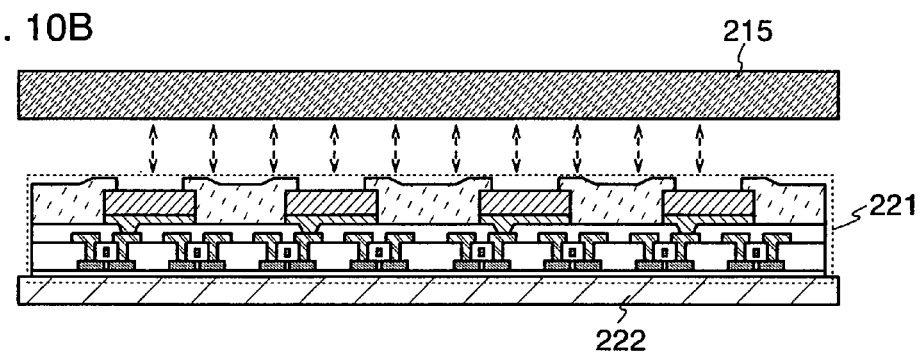

Next, as shown in FIG. 10B, a flexible substrate 222 is attached to the insulating layer 203 of the part 221 of the element formation layer, and the adhesive 215 is peeled from the part 221 of the element formation layer. Here, a film formed from polyaniline by a cast method is used as the flexible substrate 222.

Figure 10C:
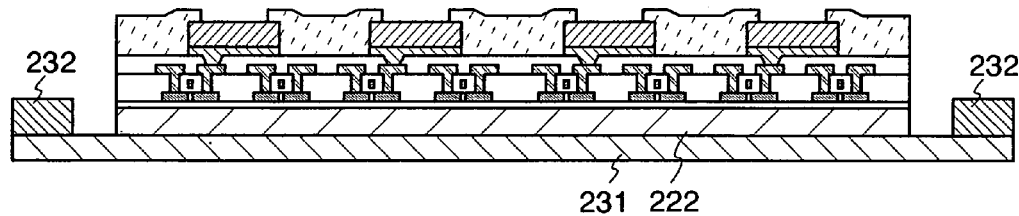

Subsequently, as shown in FIG. 10C, the flexible substrate 222 is attached to a UV sheet 231 of a dicing frame 232. Since the UV sheet 231 has adhesiveness, the flexible substrate 222 is fixed over the UV sheet 231. Thereafter, the conductive layer 211 is irradiated with laser light to enhance adhesion between the conductive layer 211 and the conductive layer 208.

Figure 10D:
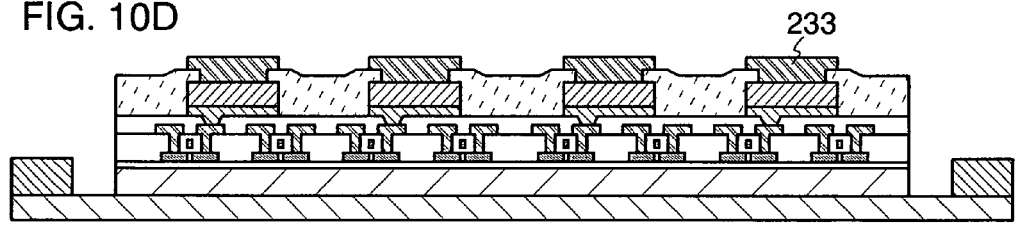

Then, as shown in FIG. 10D, a connection terminal 233 is formed over the conductive layer 211. By forming the connection terminal 233, alignment with and attachment to a conductive layer serving as an antenna later can be easily performed.

Figure 11A:
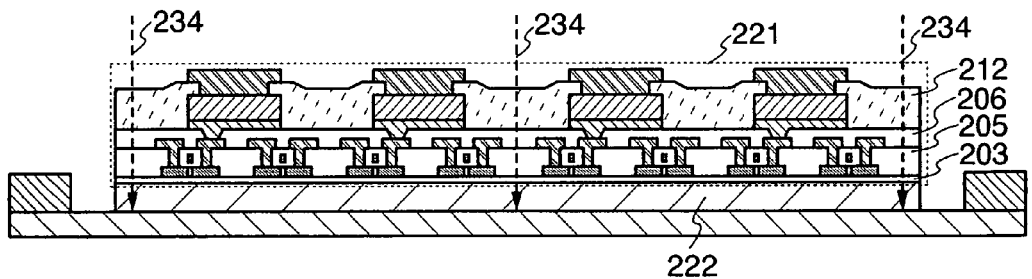
FIGS. 11A to 11C are cross-sectional views each showing a step for manufacturing a semiconductor device of the present invention.
Figure 11B:
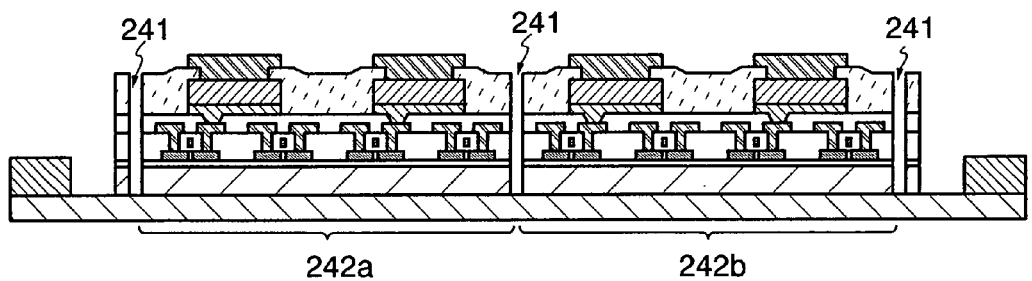

Next, as shown in FIG. 11A, the part 221 of the element formation layer is divided into parts. Here, the part 221 of the element formation layer and the flexible substrate 222 are irradiated with laser light 234 to divide the part 221 of the element formation layer into a plurality as shown in FIG. 11B. As for the laser light 234, the laser light that is described for the laser light 213 can be applied by being appropriately selected. Laser light that can be absorbed by the insulating layers 203, 205, and 206, the layer 212, and the flexible substrate 222 is preferably selected. Although the part of the element formation layer is divided into a plurality by using a laser cut method here, a dicing method, a scribing method, or the like can be appropriately used instead of this method. As a result, the divided element formation layer is referred to as thin film integrated circuits 242a and 242b.

Figure 11C:
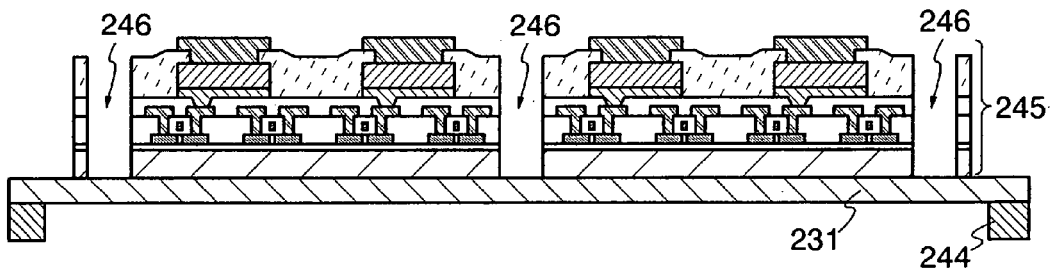

Subsequently, as shown in FIG. 11C, the UV sheet of the dicing frame 232 is irradiated with UV light to lower the adhesiveness of the UV sheet 231, and then, the UV sheet is supported by an expander frame 244. At this time, the UV sheet 231 is supported by the expander frame 244 while being extended, whereby the width of a groove 241 formed between the thin film integrated circuits 242a and 242b can be expanded. It is to be noted that the size of an expanded groove 246 preferably corresponds to the size of an antenna substrate attached to the thin film integrated circuits 242a and 242b in a subsequent step.

Figure 12A:
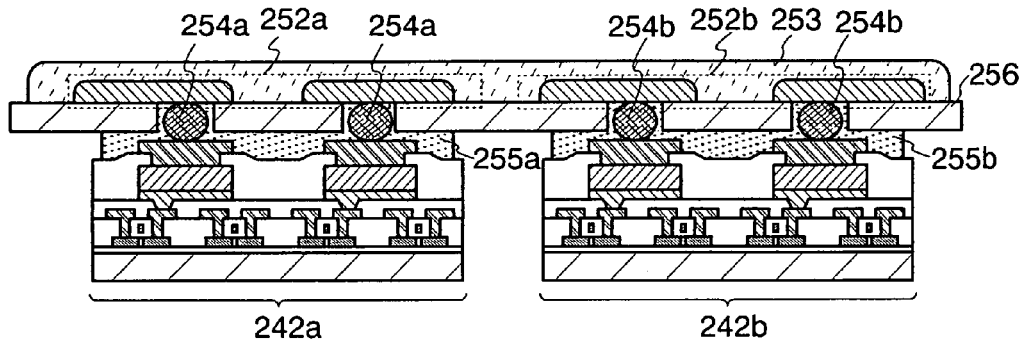
FIGS. 12A to 12D are cross-sectional views each showing a step for manufacturing a semiconductor device of the present invention.

Next, as shown in FIG. 12A, a flexible substrate 256 having conductive layers 252a and 252b each serving as an antenna and the thin film integrated circuits 242a and 242b are attached with anisotropic conductive adhesives 255a and 255b. Openings are provided in the flexible substrate 256 having the conductive layers 252a and 252b each serving as an antenna so as to expose part of the conductive layers 252a and 252b. Therefore, the conductive layers 252a and 252b each serving as an antenna and each of the connection terminals of the thin film integrated circuits 242a and 242b are attached while being aligned so as to be connected to each other through conductive particles 254a and 254b included in the anisotropic conductive adhesives 255a and 255b, respectively.

In this embodiment, the conductive layers 252a and 252b and the connection terminals of the thin film integrated circuits 242a and 242b are connected with the use of the anisotropic conductive adhesives 255a and 255b; however, a method such as reflow treatment using an anisotropic conductive film or a solder bump may be used instead of the above. Further, the conductive layers 252a and 252b and the connection terminals of the thin film integrated circuits 242a and 242b may be connected by ultrasonic welding.

Here, the conductive layer 252a serving as an antenna and the thin film integrated circuit 242a are connected through the conductive particle 254a in the anisotropic conductive adhesive 255a. The conductive layer 252b serving as an antenna and the thin film integrated circuit 242b are connected through the conductive particle 254b in the anisotropic conductive adhesive 255b.

Figure 12B:
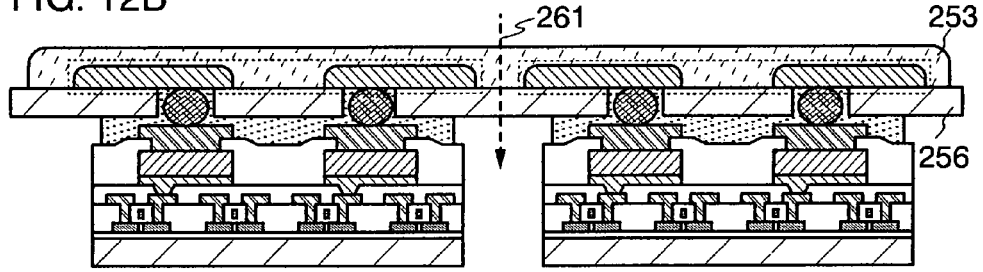

Next, as shown in FIG. 12B, division is performed in a region where the conductive layers 252a and 252b each serving as an antenna and the thin film integrated circuits 242a and 242b are not formed. Here, division is performed by a laser cut method in which the insulating layer 253 and the flexible substrate 256 are irradiated with laser light 261.

Figure 12C:
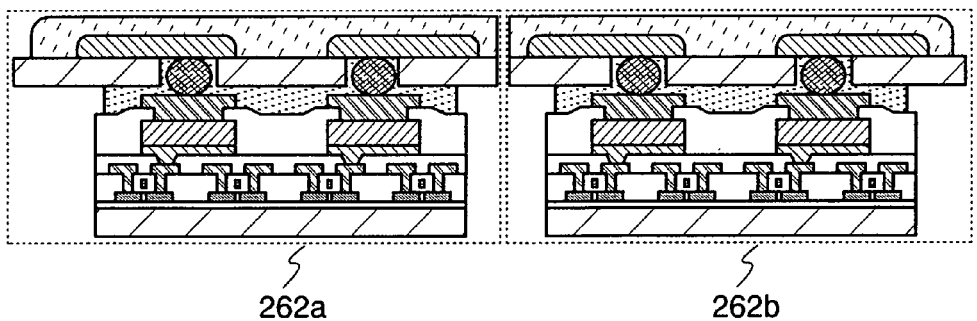

According to the above steps, semiconductor devices 262a and 262b capable of transmitting data wirelessly can be manufactured as shown in FIG. 12C.

Figure 12D:
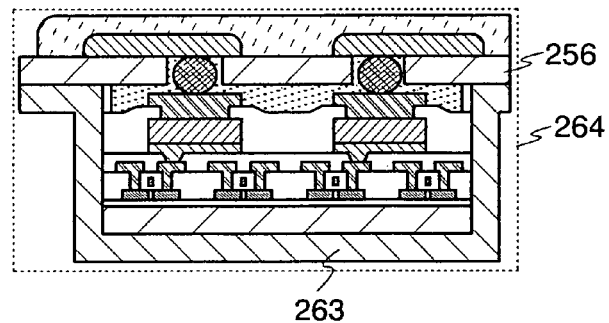

Alternatively, a semiconductor device 264 shown in FIG. 12D may be manufactured by the following steps: providing a flexible substrate so as to seal the flexible substrate 256 having the conductive layers 252a and 252b each serving as an antenna and the thin film integrated circuits 242a and 242b after the flexible substrate 256 and the thin film integrated circuits 242a and 242b are attached with the use of the anisotropic conductive adhesives 255a and 255b as shown in FIG. 12A; and irradiating the region where the conductive layers 252a and 252b each serving as an antenna and the thin film integrated circuits 242a and 242b are not formed with the laser light 261 as shown in FIG. 12B. In this case, the thin film integrated circuit is sealed with the divided flexible substrate 256 and a divided flexible substrate 263; therefore, deterioration of the thin film integrated circuit can be suppressed.

According to the above steps, a semiconductor device that is thin and lightweight can be manufactured at a high yield. Since a layer formed from a conductive polymer is included, a semiconductor device that can prevent breakdown and malfunction in the semiconductor integrated circuit due to static electricity while suppressing interruption of an electric wave and an electromagnetic wave can be manufactured.

Embodiment 2

Figure 13:
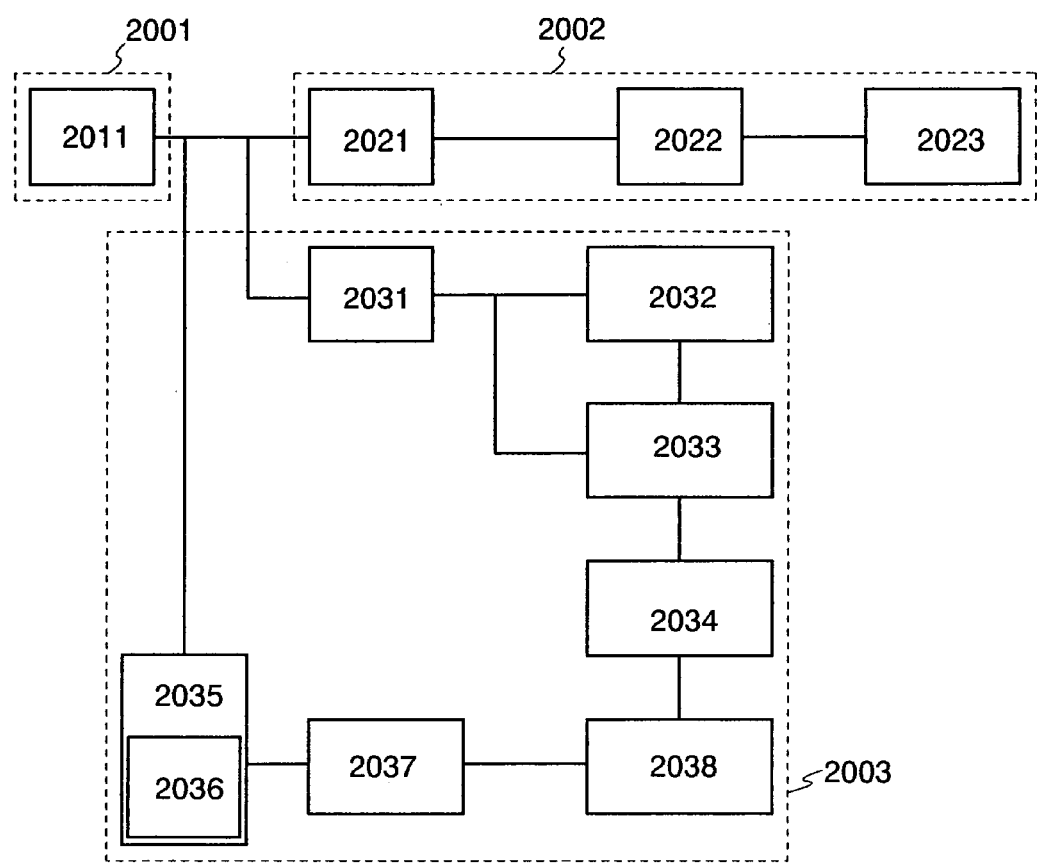
FIG. 13 is a view showing a semiconductor device of the present invention.

A structure of the semiconductor device capable of transmitting data wirelessly of the above embodiment will be explained with reference to FIG. 13.

The semiconductor device of this embodiment is mainly constituted by an antenna portion 2001, a power supply portion 2002, and a logic portion 2003.

The antenna portion 2001 includes an antenna 2011 for receiving an external signal and transmitting data. As for a signal transmission method in the semiconductor device, an electromagnetic coupling method, an electromagnetic induction method, a microwave method, or the like can be used. The transmission method may be appropriately selected in consideration of use application by a practitioner, and the most suitable antenna may be provided in accordance with the transmission method.

The power supply portion 2002 includes a rectifying circuit 2021 for generating power supply by a received signal from an external portion through the antenna 2011, a storage capacitor 2022 for storing the generated power supply and a voltage-regulator circuit 2023.

The logic portion 2003 includes a demodulation circuit 2031 for demodulating the received signal, a clock generation and compensation circuit 2032 for generating a clock signal, a circuit 2033 for recognizing and determining each code, a memory controller 2034 for generating a signal for reading data from a memory by the received signal, a modulation circuit 2035 for transmitting an encoded signal into the received signal, an encode circuit 2037 for encoding the read data, and a mask ROM 2038 for storing the data. The modulation circuit 2035 includes a modulation resistor 2036.

As a code that is recognized and determined by the circuit 2033 for recognizing and determining each code, an end of frame (EOF) signal, a start of frame (SOF) signal, a flag, a command code, a mask length, a mask value, and the like are given. Further, the circuit 2033 for recognizing and determining each code also includes a cyclic redundancy check (CRC) function for identifying a transmission error.

Embodiment 3

Figure 14A:
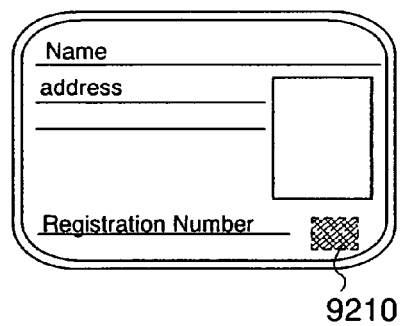
FIGS. 14A to 14F are views each showing an application example of a semiconductor device of the present invention.
Figure 14B:
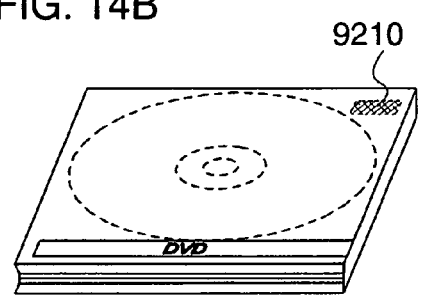
Figure 14C:
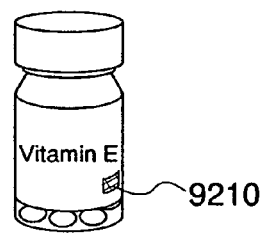
Figure 14D:
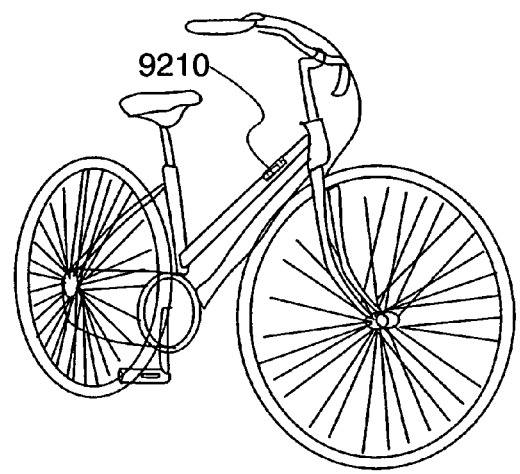
Figure 14E:
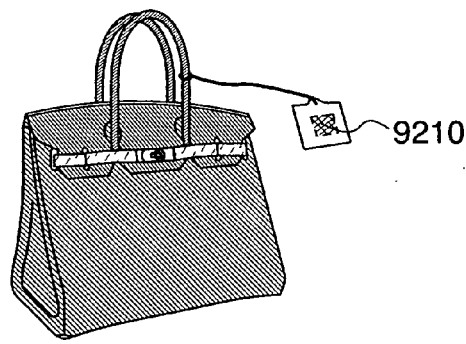
Figure 14F:
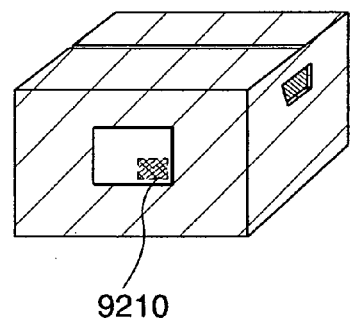

The semiconductor device capable of transmitting data wirelessly as shown the above embodiment is acceptable for a wide range of products. For example, the semiconductor device can be applied to bills, coins, securities, bearer bonds, identification certificates (a driver's license, a certificate of residence, and the like, refer to FIG. 14A), containers for package (wrapping paper, bottles, and the like, refer to FIG. 14C), recording media (DVD software, video tapes, and the like, refer to FIG. 14B), vehicles (bicycles and the like, refer to FIG. 14D), personal belongings (bags, glasses, and the like), foods, plants, animals, human bodies, clothes, commodities, electronic appliances, baggage tags (refer to FIGS. 14E and 14F), and the like. The electronic appliances include a liquid crystal display device, an EL display device, a television device (also referred to as simply a TV, a TV receiver, or a television receiver), a cellular phone, and the like.

A semiconductor device 9210 of this embodiment is fixed to a product by being mounted on a printed substrate, attached to a surface of the product, or embedded inside the product. For example, if the product is a book, the semiconductor device 9210 is fixed to the book by attaching it inside the paper, and if the product is a package made from an organic resin, the semiconductor device 9210 is fixed to the package by attaching it inside the organic resin. Since the semiconductor device 9210 of this embodiment can achieve a device that is small-sized, thin, and lightweight, the design quality of the product itself is not degraded even after the semiconductor device is fixed to the product. By providing the semiconductor device 9210 of this embodiment in bills, coins, securities, bearer bonds, identification certificates, and the like, a certification function can be provided and forgery can be prevented through use of the certification function. Moreover, when the semiconductor device of this embodiment is provided in containers for package, recording media, personal belongings, foods, clothes, commodities, electronic appliances, and the like, systems such as an inspection system can become more efficient.

This application is based on Japanese Patent Application serial no. 2006-031720 filed in Japan Patent Office on Feb. 8 in 2006, the entire contents of which are hereby incorporated by reference.

What is claimed is:

1. A semiconductor device comprising:
   a semiconductor integrated circuit;
   a connection terminal electrically connected to the semiconductor integrated circuit;
   a conductive polymer substrate provided with an antenna that comprises a conductive layer; and
   an anisotropic conductive adhesive including a conductive polymer and a conductive particle for electrically connecting the connection terminal and the antenna,
   wherein a volume resistivity of the conductive polymer is greater than or equal to $10^3$ Ω·cm and less than or equal to $10^6$ Ω·cm.

2. A semiconductor device according to claim 1, wherein, the semiconductor device is one selected from the group consisting of an IC card, an RFID tag, an IC tag, an ID tag, a transponder, an IC chip, and an ID chip.

3. A semiconductor device according to claim 1, wherein, the semiconductor device is incorporated in one selected from the group consisting of an identification certificate, a recording media, a container for package, a vehicle, and a baggage tag.

4. A semiconductor device comprising:
   a semiconductor integrated circuit;
   a connection terminal electrically connected to the semiconductor integrated circuit;
   a conductive polymer substrate provided with an antenna that comprises a conductive layer over the semiconductor integrated circuit; and
   an anisotropic conductive adhesive including a conductive polymer and a conductive particle for electrically connecting the connection terminal and the antenna,
   wherein a volume resistivity of the conductive polymer is greater than or equal to $10^3$ Ω·cm and less than or equal to $10^6$ Ω·cm.

5. A semiconductor device according to claim 4, wherein, the semiconductor device is one selected from the group consisting of an IC card, an RFID tag, an IC tag, an ID tag, a transponder, an IC chip, and an ID chip.

6. A semiconductor device according to claim 4, wherein, the semiconductor device is incorporated in one selected from the group consisting of an identification certificate, a recording media, a container for package, a vehicle, and a baggage tag.

7. A semiconductor device comprising:
   a semiconductor integrated circuit;
   a connection terminal electrically connected to the semiconductor integrated circuit;
   a conductive polymer substrate provided with an antenna that comprises a conductive layer; and
   an anisotropic conductive adhesive including a conductive polymer and a conductive particle for electrically connecting the connection terminal and the antenna,
   wherein a volume resistivity of each of the conductive polymer substrate and the conductive polymer is greater than or equal to $10^3$ Ω·cm and less than or equal to $10^6$ Ω·cm.

8. A semiconductor device according to claim 7, wherein, the semiconductor device is one selected from the group consisting of an IC card, an RFID tag, an IC tag, an ID tag, a transponder, an IC chip, and an ID chip.

9. A semiconductor device according to claim 7, wherein, the semiconductor device is incorporated in one selected from the group consisting of an identification certificate, a recording media, a container for package, a vehicle, and a baggage tag.

10. A semiconductor device comprising:
    a semiconductor integrated circuit;
    a connection terminal electrically connected to the semiconductor integrated circuit;
    a conductive polymer substrate provided with an antenna that comprises a conductive layer over the semiconductor integrated circuit; and
    an anisotropic conductive adhesive including a conductive polymer and a conductive particle for electrically connecting the connection terminal and the antenna,
    wherein a volume resistivity of each of the conductive polymer substrate and the conductive polymer is greater than or equal to $10^3$ Ω·cm and less than or equal to $10^6$ Ω·cm.

11. A semiconductor device according to claim 10, wherein, the semiconductor device is one selected from the group consisting of an IC card, an RFID tag, an IC tag, an ID tag, a transponder, an IC chip, and an ID chip.

12. A semiconductor device according to claim 10, wherein, the semiconductor device is incorporated in one selected from the group consisting of an identification certificate, a recording media, a container for package, a vehicle, and a baggage tag.

* * * * *